(12) United States Patent
Tamaki et al.

(10) Patent No.: US 8,860,301 B2
(45) Date of Patent: Oct. 14, 2014

(54) DIMMING METHOD OF ORGANIC EL DISPLAYING APPARATUS AND ORGANIC EL DISPLAYING APPARATUS

(75) Inventors: Junya Tamaki, Chiba (JP); Takashi Moriyama, Funabashi (JP); Nobuhiko Sato, Mobara (JP); Kaoru Okamoto, Chiba (JP); Yasushi Iwakura, Funabashi (JP); Masahiro Fushimi, Mobara (JP)

(73) Assignee: Canon Kabushiki Kaisha, Tokyo (JP)

( * ) Notice: Subject to any disclaimer, the term of this patent is extended or adjusted under 35 U.S.C. 154(b) by 239 days.

(21) Appl. No.: 13/296,547

(22) Filed: Nov. 15, 2011

(65) Prior Publication Data

US 2012/0127217 A1    May 24, 2012

(30) Foreign Application Priority Data

Nov. 24, 2010 (JP) ................................. 2010-261309
Sep. 28, 2011 (JP) ................................. 2011-213176

(51) Int. Cl.
*H01J 1/62* (2006.01)
*H01J 63/04* (2006.01)
*G09G 3/32* (2006.01)
*H01L 27/32* (2006.01)

(52) U.S. Cl.
CPC ........ *G09G 3/3233* (2013.01); *H01L 2251/568* (2013.01); *H01L 27/3244* (2013.01)

USPC ........... 313/505; 313/483; 313/500; 313/501; 313/502; 313/503; 313/504; 313/506

(58) Field of Classification Search
None
See application file for complete search history.

(56) References Cited

U.S. PATENT DOCUMENTS 6,828,952 B2 * 12/2004 Jinno ............................. 345/92

FOREIGN PATENT DOCUMENTS

JP              2004-6339 A      1/2004

* cited by examiner

*Primary Examiner* — Natalie Walford
(74) *Attorney, Agent, or Firm* — Fitzpatrick, Cella, Harper & Scinto

(57) ABSTRACT

A dimming method of an organic EL displaying apparatus having a displaying unit constructed by combining pixels each having a substrate, an organic EL element formed over the substrate, a power supply line for supplying a power source to the organic EL element, and at least one TFT provided on a wiring path from the power supply line to the organic EL element. The TFT has a semiconductor layer which is arranged between a source electrode and a drain electrode and is electrically connected to the source electrode and the drain electrode. A laser beam is irradiated from a downward direction of the substrate to a region which does not overlap a gate electrode, the source electrode, the drain electrode, and the wiring layer when seen as a plan view in a plane region where the semiconductor layer is provided.

10 Claims, 9 Drawing Sheets

DIMMING METHOD OF ORGANIC EL DISPLAYING APPARATUS AND ORGANIC EL DISPLAYING APPARATUS

BACKGROUND OF THE INVENTION

1. Field of the Invention

The present invention relates to a dimming method of an organic EL (electroluminescence) displaying apparatus as one kind of restoring techniques of the organic EL displaying apparatus in which organic EL elements are arranged in a matrix form.

2. Description of the Related Art

An organic EL displaying apparatus is an apparatus constructed in such a manner that a plurality of pixels each having an organic EL element and a driving circuit for driving the organic EL element are arranged on a substrate in a matrix form.

There is a case where a defect occurs in the driving circuit provided every pixel due to a defect in a manufacturing step of the organic EL displaying apparatus, so that defective display occurs in the organic EL displaying apparatus. As an example of the defective display, there is such a defect (defective bright-spot) that a bright-spot pixel in which the organic EL element is turned on even in a black displaying mode occurs.

Japanese Patent Application Laid-Open No. 2004-006339 discloses a method whereby, in an organic EL displaying apparatus, a laser beam is selectively irradiated to a part of a semiconductor layer included in a thin film transistor (hereinbelow, called a TFT) in a driving circuit which a bright-spot pixel has. By irradiating the laser beam to (a part of) the semiconductor layer, a resistance of the laser-irradiated semiconductor layer increases, so that dimming of the bright-spot pixel can be performed (that is, light of the bright-spot pixel can be dimmed).

Further, Japanese Patent Application Laid-Open No. 2004-006339 also discloses a method whereby a region to which the laser beam is irradiated is set to a region where a gate electrode layer is arranged upward in the semiconductor layer included in the TFT. According to such a method, the laser beam irradiated from a downward direction is reflected by the gate electrode layer, thereby enabling the dimming to be efficiently performed (that is, enabling the light to be efficiently dimmed).

However, if the method disclosed in Japanese Patent Application Laid-Open No. 2004-006339 is applied to the organic EL displaying apparatus, there are the following problems. That is, when the laser beam is irradiated from the downward direction of the substrate toward the semiconductor layer in order to perform the dimming of the bright-spot pixel, there is a possibility that the laser beam is irradiated to the region where the gate electrode layer provided over the semiconductor layer is arranged. There is such a problem that if the laser beam is irradiated to the gate electrode layer, the semiconductor layer and the gate electrode layer are short-circuited, so that the dimming of the bright-spot pixel is not performed.

There is also a case where even if the resistance of the TFT semiconductor layer is increased, the dimming of the bright-spot pixel is not sufficiently performed due to a variation in shape of the TFT by a process variation, a variation in characteristics, or a variation in laser beam which is irradiated. Therefore, it is necessary to increase an energy of the laser beam which is irradiated. In this case, according to the method in the related art, that is, the method whereby the laser beam is irradiated from the downward direction of the substrate toward the region where the gate electrode layer provided over the semiconductor layer is arranged, the foregoing problem of the short-circuit between the semiconductor layer and the gate electrode layer becomes more conspicuous.

SUMMARY OF THE INVENTION

The present invention has been completed to solve the foregoing problems, and it is an object of the present invention to provide a dimming method of a bright-spot pixel whereby dimming of the bright-spot pixel can be stably performed.

According to an aspect of the present invention, there is provided a dimming method of an organic EL displaying apparatus having a displaying unit constructed by combining a plurality of pixels each including: a substrate; an organic EL element formed over the substrate; a wiring layer having a power supply line to supply a power source to the organic EL element; and at least one TFT provided on a wiring path from the power supply line to the organic EL element, wherein the TFT has a semiconductor layer which is provided between a source electrode and a drain electrode and is electrically connected to the source electrode and the drain electrode, and a laser beam is irradiated from a downward direction of the substrate to a region which does not overlap a gate electrode, the source electrode, the drain electrode, and the wiring layer when seen as a plan view in a plane region where the semiconductor layer is provided.

According to the present invention, the dimming method of a bright-spot pixel whereby the dimming of the bright-spot pixel is stably performed and an influence on a display of an adjacent pixel is reduced can be provided. That is, according to the dimming method of the present invention, since the laser beam is not irradiated to the gate electrode, source electrode, drain electrode, and wiring layer, the dimming of the bright-spot pixel can be stably performed and the influence on the display of the adjacent pixel can be reduced.

Further features of the present invention will become apparent from the following description of exemplary embodiments with reference to the attached drawings.

DESCRIPTION OF THE EMBODIMENTS

The present invention relates to a dimming method of an organic EL displaying apparatus having a displaying unit constructed by combining a plurality of pixels each including: a substrate; an organic EL element formed over the substrate; a wiring layer having a power supply line to supply a power source to the organic EL element; and at least one TFT provided on a wiring path from the power supply line to the organic EL element. In the present invention, the TFT included in the organic EL displaying apparatus has a semiconductor layer which is provided between a source electrode and a drain electrode and is electrically connected to the source electrode and the drain electrode. According to the dimming method of the present invention, a laser beam is selectively irradiated from a downward direction of the substrate to a region which does not overlap a gate electrode, the source electrode, the drain electrode, and the wiring layer when seen as a plan view in a plane region where the semiconductor layer is provided. By the irradiation of the laser beam, a resistance of a part of the semiconductor layer is increased and the dimming of a bright-spot pixel can be performed. In the present invention, the region where the semiconductor layer does not overlap the members when seen as a plan view indicates a region where when the semiconductor layer provided for the organic EL displaying apparatus is seen from a plane, the semiconductor layer can be directly seen and confirmed without being blocked by the members. In the following description, there is a case where the wiring layer is also called "other wiring layers such as a power supply line and the like".

Embodiments of the present invention will be specifically described hereinbelow with reference to the drawings. In the diagrams, since each member is illustrated in a size which can be recognized, there is a case where its scale on the diagram differs from the actual size. In the following description, it is assumed that the well-known techniques in the relevant technical field can be applied with respect to, particularly, portions which are not illustrated or disclosed.

First Embodiment

Figure 1:
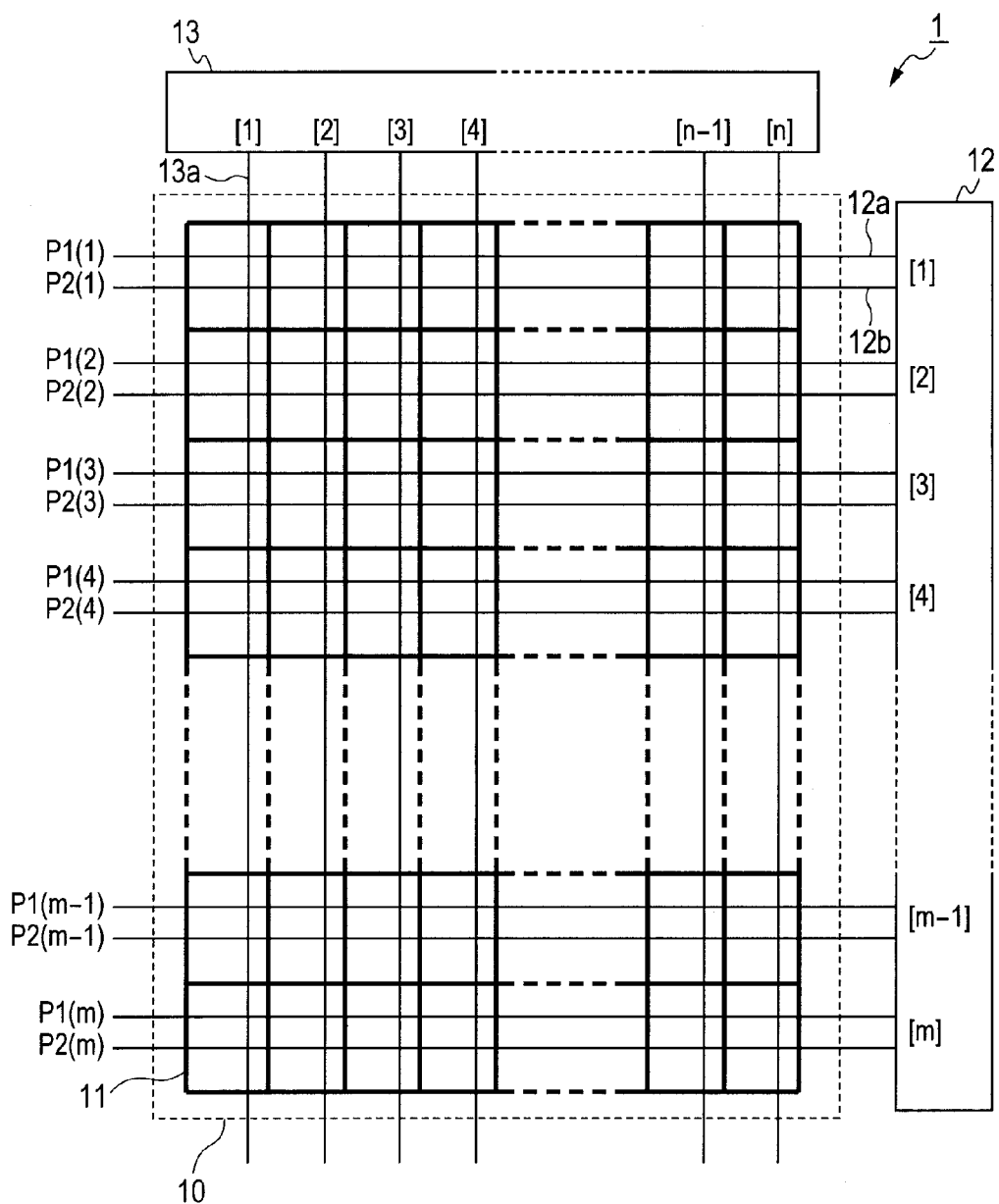
FIG. 1 is a diagram illustrating a wiring situation of an organic EL displaying apparatus in a first embodiment.

The first embodiment of the present invention will be described hereinbelow. FIG. 1 is a diagram illustrating a wiring situation of an organic EL displaying apparatus in the present embodiment.

An organic EL displaying apparatus 1 in the present embodiment has: a displaying region 10 in which a plurality of pixels 11 are arranged in a 2-dimensional form of m rows×n columns (m and n are natural numbers); and a row controlling circuit 12 and a column controlling circuit 13 which are provided around the displaying region 10. The organic EL displaying apparatus 1 in the present embodiment has a plurality of combinations each constructed by pixels 11R (not illustrated), 11G (not illustrated), and 11B (not illustrated) of three different hues of R (red), G (green), and B (blue).

Each pixel 11 in the displaying region is constructed by: an organic EL element, which will be described hereinafter; and a pixel circuit constructed by a TFT for controlling a current which is supplied to the organic EL element. The pixel circuit will be described hereinafter.

A plurality of kinds (two kinds) of gate control signals P1(1) to P1(m) and P2(1) to P2(m) are output from output terminals of the row controlling circuit 12, respectively. The gate control signal P1 is input to the pixel circuit of each row through a gate line 12a. The gate control signal P2 is input to the pixel circuit of each row through a gate line 12b. A video signal is input to the column controlling circuit 13. A data voltage $V_{data}$ serving as gradation display data is output from each output terminal. The data voltage $V_{data}$ is input to the pixel circuit of each column through a data line 13a. The data voltage $V_{data}$ which is input as a data signal has a voltage value between a data voltage (black signal) corresponding to minimum gradation display data and a data voltage (white signal) corresponding to maximum gradation display data. Thus, the organic EL displaying apparatus 1 performs a gradation display.

Figure 2A:
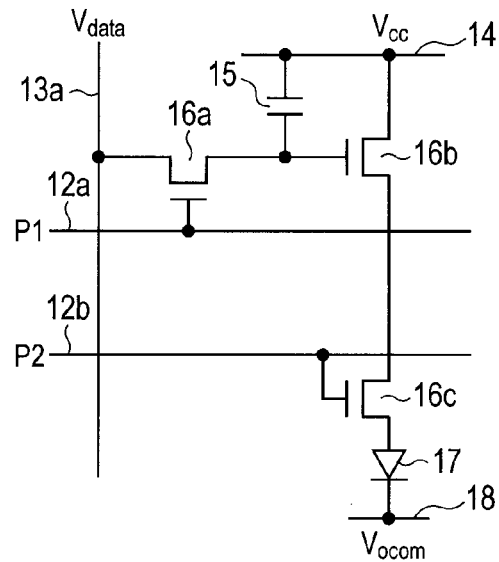
FIG. 2A is a circuit diagram of a pixel included in the organic EL displaying apparatus of FIG. 1.
Figure 2B:
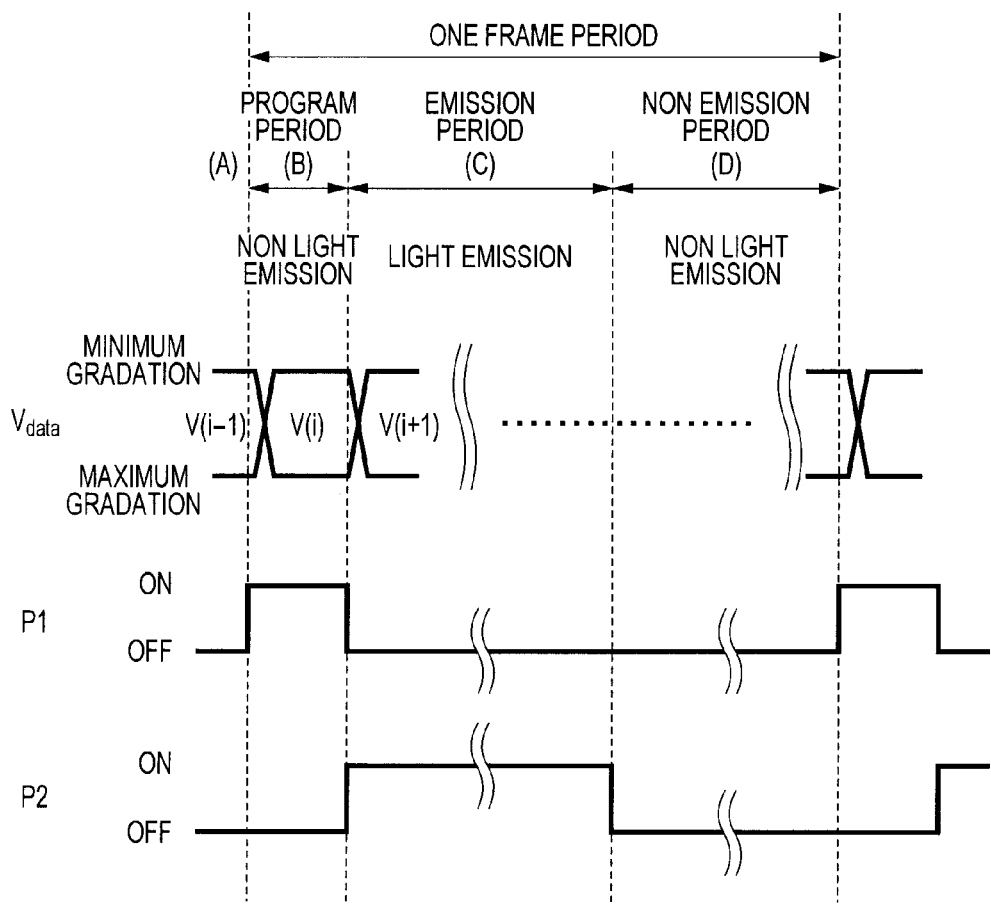
FIG. 2B is a diagram illustrating an example of a driving sequence of the circuit (pixel circuit) illustrated in FIG. 2A.

FIG. 2A is a circuit diagram of the pixel included in the organic EL displaying apparatus of FIG. 1. FIG. 2B is a diagram illustrating an example of a driving sequence of the circuit (pixel circuit) illustrated in FIG. 2A.

The pixel circuit of FIG. 2A is constructed by: two kinds of gate lines (12a, 12b); the data line 13a; a power supply line 14; a storage capacitor 15; three kinds of TFTs (16a, 16b, 16c); and an organic EL element 17. In the pixel circuit of FIG. 2A, the two kinds of gate lines correspond to the two kinds of gate lines 12a and 12b illustrated in FIG. 1, respectively. In the pixel circuit of FIG. 2A, the three kinds of TFTs are the TFT for selecting (selecting TFT) (TFT for switching (switching TFT)) 16a, the TFT for driving (driving TFT) 16b, and the TFT for controlling an emission period (emission period controlling TFT) 16c. The selecting TFT 16a and the emission period controlling TFT 16c are the N-type TFTs. The driving TFT 16b is the P-type TFT.

In the selecting TFT 16a, a gate terminal is connected to the gate line 12a, a drain terminal is connected to the data line 13a, and a source terminal is connected to a gate terminal of the driving TFT 16b, respectively. In the driving TFT 16b, a source terminal is connected to the power supply line 14 and a drain terminal is connected to a drain terminal of the emission period controlling TFT 16c, respectively. In the emission period controlling TFT 16c, a gate terminal is connected to the gate line 12b and a source terminal is connected to an anode of the organic EL element 17. A cathode of the organic EL element 17 is connected to a grounding line 18. The storage capacitor 15 is arranged between the power supply line 14 and the gate terminal of the driving TFT 16b.

An example of a driving sequence of the pixel circuit of the organic EL displaying apparatus 1 of the present embodiment will be described with reference to FIG. 2B. In FIG. 2B, the following periods (B) to (D) are included in one frame period.

Period (B): Program period for which the gradation display data is written into a target pixel to be driven with respect to the column (target column)·the row (target row) in which the target pixel exists;

Period (C): Emission period for which the organic EL element 17 of the target pixel emits light by an arbitrary duty; and Period (D): Non emission period for which the organic EL element of the target pixel is controlled to a non emitting mode.

In FIG. 2B, V(i−1), V(i), and V(i+1) indicate the data voltages $V_{data}$ which are input to the pixel circuit of the (i−1)th row (one-precedent row of the target row), the ith row (target row), and the (i+1)th row (one-subsequent row of the target row) in the one frame period of the target column, respectively.

A driving sequence of FIG. 2B will be described in more detail hereinbelow with reference to the circuit of FIG. 2A.

In the period (A), in the pixel circuit of the target row, a low level signal is input to the gate line 12a and the selecting TFT 16a is OFF. In this state, the data voltage V(i−1) as gradation display data of the one-precedent row is not input to the pixel circuit of the ith row as a target row.

In the period (B), a high level signal is input to the gate line 12a and the selecting TFT 16a is turned on. In this state, the data voltage V(i) as gradation display data of the relevant row is input to the pixel circuit of the ith row. Electric charges corresponding to the input data voltage V(i) are charged into the storage capacitor 15 and programming of the gradation display data is performed. For this period, the low level signal is input to the gate line 12b and the emission period controlling TFT 16c is OFF. Therefore, in this period, a current is not supplied to the organic EL element 17 and the organic EL element 17 does not emit light.

In the period (C), the low level signal is input to the gate line 12a and the selecting TFT 16a is turned off. Therefore, the data voltage V(i+1) as gradation display data of the one-subsequent row is not input to the pixel circuit of the ith row as a target row. The electric charges charged in the storage capacitor 15 for the period (B) are maintained. In this period, the high level signal is input to the gate line P2 (12b) and the emission period controlling TFT 16c is turned on. Therefore, the electric charges charged in the storage capacitor 15 for the period (B) and the current according to the gate voltage of the driving TFT 16b are supplied to the organic EL element 17 and the organic EL element 17 emits light at luminance of the gradation according to the supplied current.

In the period (D), the low level signal is input to the gate line 12b and the emission period controlling TFT 16c is turned off. Therefore, in this period, the organic EL element 17 does not emit light.

Figure 3A:
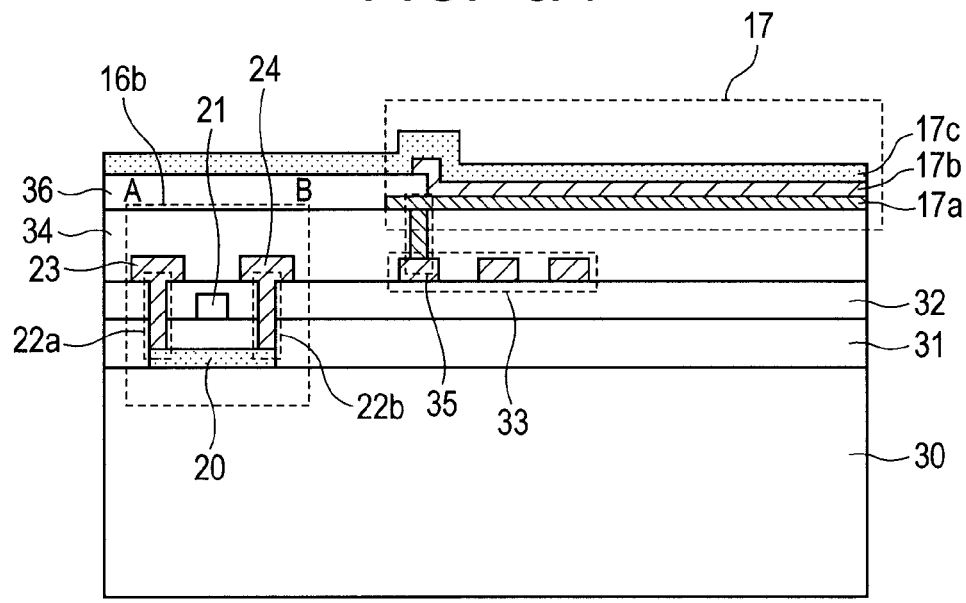
FIG. 3A is a schematic cross sectional view illustrating the organic EL displaying apparatus of FIG. 1.
Figure 3B:
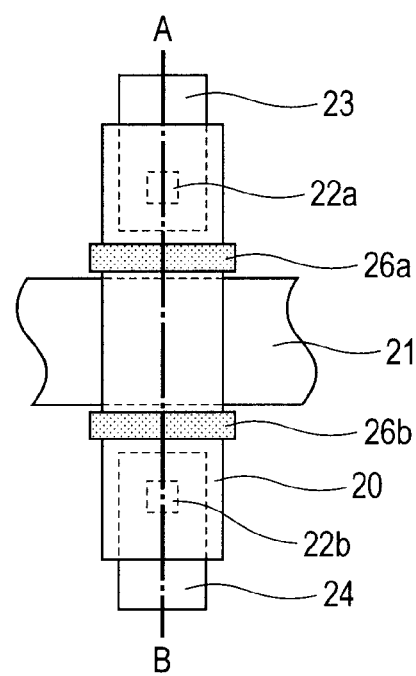
FIG. 3B is a schematic diagram illustrating a partial plane structure of a region of an AB interval in FIG. 3A.

FIG. 3A is a schematic cross sectional view illustrating the organic EL displaying apparatus of FIG. 1. FIG. 3B is a schematic diagram illustrating a partial plane structure of a region (driving TFT 16b) of an AB interval in FIG. 3A and is a diagram when seen from the downward direction of the substrate.

FIG. 3A illustrates a cross sectional structure including the driving TFT 16b as a part of the organic EL displaying apparatus of FIG. 1. Although the organic EL element 17 illustrated in FIG. 3A is the organic EL element of a top emission type, the dimming method of the present embodiment can be also applied to an organic EL element of a bottom emission type.

In the organic EL displaying apparatus of FIG. 3A, a semiconductor layer 20 is formed in a specific region on a substrate 30. A gate insulating film 31 is formed on the semiconductor layer 20. A gate electrode 21 is formed on the gate insulating film 31. Although not illustrated, the gate electrode 21 is connected to the source terminal of the selecting TFT 16a. An interlayer insulating film 32 is formed on the gate insulating film 31 and the gate electrode 21. As illustrated in FIG. 3A, the gate electrode 21 is covered with the interlayer insulating film 32.

Two kinds of contact holes (22a, 22b) are formed in the gate insulating film 31 and the interlayer insulating film 32. The contact hole 22a is formed to make the semiconductor layer 20 and a source electrode 23 formed in a predetermined region on the interlayer insulating film 32 conductive. The contact hole 22b is formed to make the semiconductor layer 20 and a drain electrode 24 formed in a predetermined region on the interlayer insulating film 32 conductive. A plurality of wirings 33 are formed on the interlayer insulating film 32. It is desirable that an insulating film 34 to flatten steps (concave and convex portions) caused by providing the TFTs is formed on the source electrode 23 and the drain electrode 24. A contact hole 35 is formed in the insulating film 34. The wirings 33 are conductive with a first electrode 17a of the organic EL element 17 through the contact hole 35.

Although not illustrated, the wirings 33 which are conductive with the first electrode 17a are conductive with the drain electrode 24 of the driving TFT 16b through the emission period controlling TFT 16c. An organic EL layer 17b and a second electrode 17c are formed on the first electrode 17a in this order. The organic EL element 17 is partitioned by a bank 36 formed in a predetermined region on the insulating film 34.

The members illustrated in the organic EL displaying apparatus of FIG. 3A can be formed by using well-known materials by a well-known method.

Subsequently, the dimming method in the present embodiment will be described in detail.

The dimming method of the present invention, that is, a dimming process is applied to a case where a defect occurs in a driving circuit provided for pixel due to a defect in a manufacturing step of the organic EL displaying apparatus, so that a defective bright-spot occurs in the organic EL displaying apparatus.

In the organic EL displaying apparatus of FIG. 3A, a protecting structure (not illustrated in FIG. 3A) to protect the organic EL element 17 which is formed after the second electrode 17c was formed against the moisture and oxygen is formed. The dimming method of the present invention is executed in dependence on a result of a display inspection which is performed after the protecting structure was formed. Specifically describing, the organic EL displaying apparatus is turned on, the display inspection is performed, and the presence or absence of the occurrence of the defective bright-spot is confirmed. If the defective bright-spot occurred, the dimming process is executed by the following process.

In the present embodiment, specifically describing, the dimming method of the present invention is executed by a method whereby a laser beam is irradiated from the downward direction of the substrate 30 to the members constructing the driving TFT 16b included in the bright-spot pixel detected in the display inspection. By irradiating the laser beam, a resistance of the laser-irradiated portion rises. On the other hand, the driving TFT 16b is arranged on a wiring path from the power supply line 14 to the organic EL element 17. Therefore, since the current supply to the organic EL element 17 can be reduced by irradiating the laser beam, the dimming of the bright-spot pixel can be realized.

As described above, FIG. 3B illustrates the partial plane structure of the region of the AB interval in FIG. 3A and this structure is a plane structure of the driving TFT 16b illustrated in FIG. 3A.

In the present embodiment, as illustrated in FIG. 3B, by irradiating the laser beam from the downward direction of the substrate to a predetermined plane region in the semiconductor layer 20 or near it, that is, to a region 26a or 26b, the dimming method of the present invention can be executed. The regions 26a and 26b are regions which satisfy the following requirements (i) and (ii). Further, more desirably, they are regions which satisfy the following requirements (i), (ii), and (iii):

(i) belt-shaped region which is arranged in the direction perpendicular to the current flowing direction of the semiconductor layer 20 and includes both ends of the semiconductor layer 20;

(ii) region which does not overlap the gate electrode 21 when seen as a plan view; and (iii) region which does not overlap any of the source electrode 23, drain electrode 24, and other wiring layers such as a power supply line and the like when seen as a plan view.

In other words, the region of (ii) is a region where the semiconductor layer 20 can be directly seen and confirmed without being blocked by the gate electrode 21 when the semiconductor layer 20 is seen as a plan view. In other words, the region of (iii) is a region where the semiconductor layer 20 can be directly seen and confirmed without being blocked by any of the source electrode 23, drain electrode 24, and other wiring layers such as a power supply line and the like when the semiconductor layer 20 is seen as a plan view.

In the present embodiment, by irradiating the laser beam to the region 26a or 26b from the downward direction of the substrate, the dimming of the bright-spot pixel can be stably executed. The laser beam may be irradiated to the regions 26a and 26b. The reason why the laser beam is irradiated from the downward direction of the substrate is to prevent such a situation that the second electrode 17c is damaged since the laser beam is irradiated to the second electrode 17c. Even in the case where the organic EL element 17 is of the top emission type and the driving TFT 16b is arranged in the region which overlaps the first electrode 17a having a light reflecting property when seen as a plan view, by irradiating the laser beam from the downward direction of the substrate, the laser beam can be irradiated to the region 26a or 26b.

The laser beam is irradiated to the region which does not overlap the gate electrode 21, more desirably, further, any of the source electrode 23, drain electrode 24, and other wiring layers such as a power supply line and the like when seen as a plan view. This is because it is intended to prevent a deformation or the like of the members as they are which is caused since the laser beam is irradiated to the respective electrodes and the wiring layer. That is, there is a case where since the laser beam is irradiated to the respective electrodes and the wiring layer, the deformation or the like of the electrodes and the wiring layer itself occurs, so that the circuit construction changes and, accordingly, even if the resistance of the semiconductor layer 20 of the TFT is increased, the dimming of the bright-spot pixel is not performed. Therefore, it is intended to prevent such a situation as described above.

In the organic EL displaying apparatus having the pixel circuit illustrated in FIG. 2A, if the laser beam was irradiated to the region which overlaps the gate electrode 21 in the semiconductor layer 20 when seen as a plan view, the laser beam is irradiated to the gate electrode 21. Thus, there is a case where the gate electrode 21 and the drain electrode side of the semiconductor layer 20 are short-circuited. Consequently, the pixel to which the laser beam was irradiated becomes the pixel which is always turned on for the period of time of the emission period (C) during which the emission period controlling TFT 16c is ON and the dimming of the bright-spot pixel cannot be performed. Therefore, in the dimming method of the present invention, the laser beam is irradiated to the region which satisfies the foregoing requirements (i) and (ii).

However, if the laser beam was irradiated to the region which satisfies the foregoing requirements (i) and (ii) but overlaps the source electrode 23, drain electrode 24, or other wiring layers (not illustrated in FIG. 3B) such as a power supply line and the like when seen as a plan view, a success ratio of the dimming decreases by the following reasons. In the organic EL displaying apparatus having the pixel circuit illustrated in FIG. 2A, the laser beam is irradiated to the region which overlaps the source electrode 23, drain electrode 24, or other wiring layers (not illustrated in FIG. 3B) such as a power supply line and the like in the semiconductor layer 20 when seen as a plan view. Therefore, the laser beam is irradiated to the source electrode 23, drain electrode 24, or other wiring layers such as a power supply line and the like. Thus, there is a case where those layers and the semiconductor layer 20 are short-circuited. Consequently, in the pixel to which the laser beam has been irradiated, a current flows in the short-circuited portion, the current is supplied to the organic EL element 17, and the dimming of the bright-spot pixel cannot be performed. Therefore, according to the dimming method of the present invention, more desirably, the laser beam is irradiated to the region which satisfies the foregoing requirements (i), (ii), and (iii).

On the other hand, there is a case where even if the resistance of the semiconductor layer included in the TFT is increased, the dimming of the bright-spot pixel is not sufficiently performed due to the variation in shape of the TFT by the process variation, the variation in characteristics, or the variation in laser beam which is irradiated. To solve such a problem, an energy of the laser beam is increased. However, since the energy of the laser beam is increased, the foregoing problem of the short-circuit between the semiconductor layer and the gate electrode layer becomes more conspicuous. In addition, the problem of the short-circuit between the semiconductor layer and the source electrode, drain electrode, or other wiring layers such as a power supply line and the like becomes more conspicuous. Consequently, it is desirable to irradiate the laser beam to the region which satisfies the foregoing requirements (i) and (ii), more desirably, to the region which satisfies the foregoing requirements (i), (ii), and (iii).

A YAG (Yttrium Aluminum Garnet) laser, an excimer laser, or the like having a wavelength of 1064 nm, 532 nm, 355 nm, or the like can be used as a laser which is used when executing the dimming method of the present invention.

In the dimming method of the present invention, since the laser beam is irradiated from the downward direction of the substrate to the region which does not overlap the gate electrode layer when seen as a plan view, it is desirable to use the laser beam of a wavelength of, particularly, a visible light region from a viewpoint of a laser beam absorbing efficiency of the semiconductor layer. By using the laser beam of the wavelength of the visible light region, the resistance of the semiconductor layer can be more efficiently raised and the dimming of the bright-spot pixel can be more efficiently performed.

Further, in the dimming method of the present invention, it is desirable that the laser beam of the wavelength of the visible light region is used and an irradiation width of the laser beam is set to a value which is equal to or larger than about the wavelength of the laser beam in the direction parallel with the current flowing direction of the semiconductor layer 20. Further, it is desirable to set the width to a value which is equal to or larger than about 1 μm. By setting as described above, the resistance of the semiconductor layer can be stably increased.

In this instance, it is desirable that the irradiation width of the laser beam is set to a value which is equal to or less than about 2 μm in the direction parallel with the current flowing direction of the semiconductor layer 20. By setting as described above, a separation interval between the gate electrode 21 and the source electrode 23 or between the gate electrode 21 and the drain electrode 24, which will be described hereinbelow, can be decreased and a layout space can be reduced.

It is desirable that a separation interval which is equal to or larger than a value in which the irradiation width of the laser beam and a positioning tolerance of a laser beam irradiating apparatus are matched is provided between the gate electrode 21 and the source electrode 23 or between the gate electrode 21 and the drain electrode 24 in the direction parallel with the current flowing direction of the semiconductor layer 20. By providing such a separation interval as described above and, further, adjusting the irradiating region of the laser beam, the laser beam can be irradiated so as not to degenerate the members other than the semiconductor layer.

In the dimming method of the present invention, it is desirable to irradiate the laser beam only to one of the regions 26a and 26b. By using such a method, in the regions 26a and 26b, with respect to the region to which the laser beam is not irradiated, there is no need to provide the separation interval between the gate electrode and the source electrode 23 or between the gate electrode 21 and the drain electrode 24. The layout space can be reduced. The number of times of irradiation of the laser beam can be reduced. A time which is required for the dimming can be shortened.

In the dimming method of the present invention, if there are a plurality of plane regions (for example, the regions 26a and 26b in FIG. 3B) in each of which the semiconductor layer 20 to which the laser beam can be irradiated is provided, desirably, the laser beam is irradiated only to the plane region that is closest to the organic EL element 17 on the circuit. Specifically describing in FIG. 3B, it is desirable to irradiate the laser beam only to the region 26b which is closer to the organic EL element 17 on the circuit and is arranged between the gate electrode 21 and the drain electrode 24. By using such a method, even if there is a defective pattern between the regions 26a and 26b, the current supply to the organic EL element 17 can be reduced. For example, in the region where the gate electrode 21 and the semiconductor layer 20 overlap when seen as a plan view, if there is a defect in the gate insulating film 31 and there is such a defective pattern that the gate electrode 21 and the drain electrode side of the semiconductor layer 20 are short-circuited, such a pixel becomes the bright-spot pixel. Even in such a case, by irradiating the laser beam only to the region 26b between the gate electrode 21 and the drain electrode 24, a resistance of the region which is closer to the organic EL element 17 on the circuit than the short-circuited portion can be raised. Therefore, the dimming of the bright-spot pixel can be performed.

Subsequently, a specific method of alignment which is performed to the driving TFT 16b which the bright-spot pixel has when the laser beam is irradiated will be described. First, coordinates of the bright-spot pixel are obtained in the foregoing display inspection. Arbitrary reference coordinates may be used in this case. Subsequently, the organic EL displaying apparatus is moved to the laser beam irradiating apparatus and is moved to the bright-spot pixel on the basis of the coordinates obtained in the display inspection. The organic EL displaying apparatus is monitored from the substrate 30 side by an optical microscope or the like. The laser beam is irradiated to the region 26a or 26b as a region which satisfies the foregoing requirements (i) and (ii), more desirably, the requirements (i), (ii), and (iii) (the laser beam may be irradiated to the regions 26a and 26b as described above). After the laser beam was irradiated, the organic EL displaying apparatus is again turned on, the display inspection is performed, and the light emitting state at the position of the bright-spot pixel is inspected, thereby confirming that the dimming has been performed.

It is possible to construct in such a manner that a display inspecting apparatus also having the laser beam irradiating function is used, while monitoring the light emitting state in the display inspection by the optical microscope or the like, the alignment is performed to the bright-spot pixel, and at the same time, the laser beam is irradiated from the downward direction of the displaying apparatus. In this case, the movement between the display inspecting apparatus and the laser beam irradiating apparatus and the alignment step in the laser beam irradiating apparatus can be omitted, and the time which is required for the dimming can be shortened.

Although the semiconductor layer 20 included in the driving TFT 16b is used as a target in the present embodiment, the present invention is not limited to it. With respect to the semiconductor layer included in the emission period controlling TFT 16c, the laser beam may be irradiated to the region which satisfies the foregoing requirements (i) and (ii), more desirably, the foregoing requirements (i), (ii), and (iii).

Second Embodiment

Subsequently, the second embodiment of the present invention will be described. The second embodiment, which will be described hereinbelow, is one of the exemplary examples of the first embodiment. Therefore, a difference from the first embodiment will be mainly described hereinbelow. Substantially the same members as those in the first embodiment are designated by the same reference numerals and there is a case where their description is omitted in accordance with circumstances.

In the second embodiment, the pixel included in the displaying region further has a reflecting film. The reflecting film is provided to reflect the light which was emitted from the organic EL layer and progresses toward the substrate side. In the second embodiment, a protecting film is further provided on the displaying unit.

In the present embodiment, at least a part of the plane region in which the semiconductor layer is provided is a region which overlaps the reflecting film when seen as a plan view. Further, in the present embodiment, the laser beam is selectively irradiated from the downward direction of the substrate to the region which overlaps the reflecting film in the plane region where the semiconductor layer is provided when seen as a plan view but does not overlap the gate electrode, source electrode, drain electrode, and wiring layer when seen as a plan view. By the irradiation of the laser beam, a resistance of a part of the semiconductor layer is raised and the dimming of the bright-spot pixel can be performed.

Figure 4A:
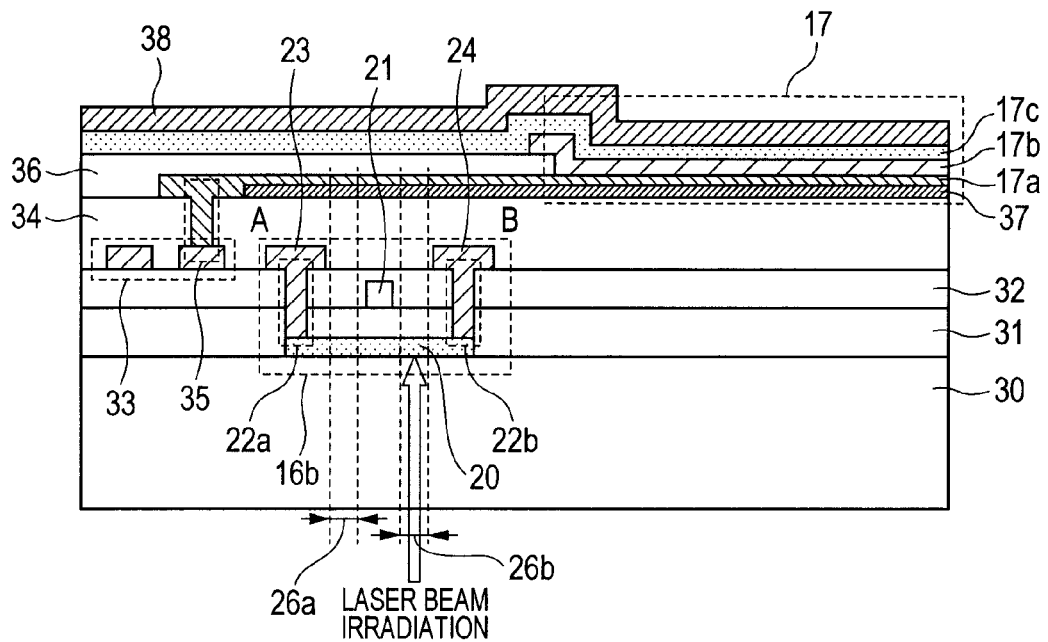
FIG. 4A is a schematic cross sectional view illustrating an organic EL displaying apparatus of a second embodiment.
Figure 4B:
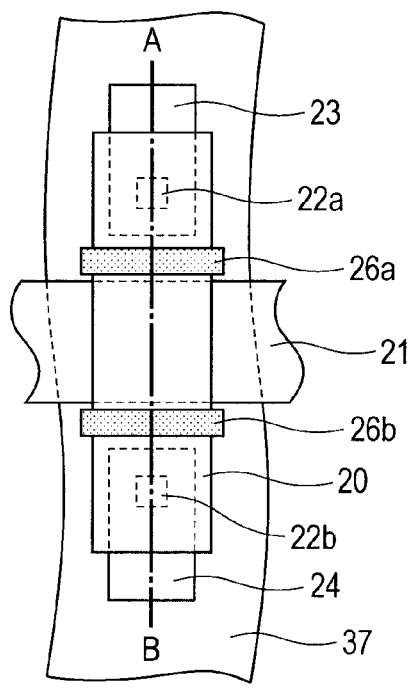
FIG. 4B is a schematic diagram illustrating a partial plane structure of a region of an AB interval in FIG. 4A.

The second embodiment will be described hereinbelow with reference to the drawings. FIG. 4A is a schematic cross sectional view illustrating an organic EL displaying apparatus of the second embodiment. FIG. 4B is a schematic diagram illustrating a partial plane structure of a region (driving TFT 16b) of an AB interval in FIG. 4A. In the second embodiment, a wiring situation of the organic EL displaying apparatus is similar to that in FIG. 1 and a pixel circuit and a driving sequence of the pixel circuit are similar to those in FIGS. 2A and 2B.

Specifically describing, FIG. 4A illustrates a cross sectional structure including the driving TFT 16b serving as a part of the organic EL displaying apparatus 1 of FIG. 1. The organic EL element 17 illustrated in FIG. 4A is an organic EL element of the top emission type.

In the organic EL displaying apparatus of FIG. 4A, the semiconductor layer 20 is formed in a specific region on the substrate 30. The gate insulating film 31 is formed on the semiconductor layer 20. The gate electrode 21 is formed on the gate insulating film 31. Although not illustrated, the gate electrode 21 is connected to the source terminal of the selecting TFT 16a. The interlayer insulating film 32 is formed on the gate insulating film 31 and the gate electrode 21. As illustrated in FIG. 4A, the gate electrode 21 is covered with the interlayer insulating film 32.

The two kinds of contact holes (22a, 22b) are formed in the gate insulating film 31 and the interlayer insulating film 32. The contact hole 22a is formed to make the semiconductor layer 20 and the source electrode 23 formed in a predetermined region on the interlayer insulating film 32 conductive. The contact hole 22b is formed to make the semiconductor layer 20 and the drain electrode 24 formed in a predetermined region on the interlayer insulating film 32 conductive. The plurality of wirings 33 are provided on the interlayer insulating film 32.

It is desirable that the insulating film 34 to flatten steps (concave and convex portions) caused by providing the TFTs is formed on the source electrode 23 and the drain electrode 24. As will be described hereinafter, when executing the dimming method in the present embodiment, the laser beam is irradiated from the downward direction of the substrate to the region which overlaps a reflecting film 37 when seen as a plan view. At this time, there is a case where since the laser beam is irradiated to the reflecting film 37, the reflecting film 37 is deformed. There is, consequently, a problem that the circuit construction changes and even if the resistance of the semiconductor layer 20 of the TFT is raised, the dimming of the bright-spot pixel is not performed. In regard to this problem, by forming the insulating film 34 to an upper layer side of the TFT, the laser beam which reaches the reflecting film 37 can be reduced and a probability of occurrence of the deformation of the reflecting film 37 can be reduced. Even if the deformation occurred in the reflecting film 37, a probability that the reflecting film 37 and the semiconductor layer 20 are short-circuited can be reduced and a probability that the circuit construction changes can be reduced.

As an insulating film 34, an inorganic film of SiN, $SiO_2$, or the like or a resin film such as, acryl resin, epoxy resin, polyimide resin, or the like can be used. The insulating film 34 is formed by a method whereby a thin film is formed by a sputtering method, a CVD method, a spin coating method, or the like and, thereafter, patterning is performed by using a photolithography method or the like with respect to the thin film. The contact hole 35 is formed in a part of the insulating film 34 by the patterning.

Particularly, in the case of the organic EL displaying apparatus of the top emission type and an active matrix type, it is desirable to use the resin film as an insulating film 34. It is also desirable to set a film thickness of the insulating film 34 to 1 μm or more.

The reflecting film 37 is formed on the insulating film 34. The reflecting film 37 is formed so as not to reach (so as not to be come into contact with) the contact hole 35. When the reflecting film 37 is provided, it is formed so that a part of a plane region where the reflecting film 37 has been provided overlaps the plane region of the driving TFT 16b where the semiconductor layer 20 has been provided when seen as a plan view.

The reflecting film 37 is formed by a method whereby a thin metal film made of a metal material consisting of a metal such as Cr, Al, Ag, Au, Pt, or the like or an alloy of them is formed by the sputtering method or the like and the thin metal film is patterned by the photolithography method or the like. It is desirable to set a thickness of the thin metal film to 50 nm or more. This is because by setting the thickness of the thin metal film as described above, a reflectance of the surface of the thin film is equal to or larger than 40% in a visible light region (wavelength within a range from 400 nm to 780 nm).

The first electrode 17a is formed on the reflecting film 37. The first electrode 17a is formed so as to cover the reflecting film 37. The first electrode 17a is formed so as to reach (so as to be come into contact with) the contact hole 35. The wirings 33 are conductive with the first electrode 17a of the organic EL element 17 through the contact hole 35. Although not shown, the wirings 33 which are conductive with the first electrode 17a are conductive with the drain electrode 24 of the driving TFT 16b through the emission period controlling TFT 16c.

The first electrode 17a is formed by a method whereby an oxide conductive film of indium tin oxide, indium zinc oxide, or the like is formed by the sputtering method or the like and is patterned by the photolithography method or the like.

It is also possible to construct in such a manner that after the reflecting film 37 was formed, the film of the first electrode 17a is formed and those two layers are patterned in a lump. In this case, the patterning is performed so that those two layers reach the contact hole 35, thereby making them conductive with the wirings 33.

The organic EL layer 17b and the second electrode 17c are formed on the first electrode 17a in this order. The organic EL element 17 is constructed by the first electrode 17a, organic EL layer 17b, and second electrode 17c. The organic EL element 17 is partitioned by the bank 36 formed in a predetermined region on the insulating film 34.

A protecting film 38 to protect the organic EL element against the moisture and oxygen is formed on the second electrode 17c. That is, the protecting film 38 is formed on a displaying region (displaying region 10). Although it is desirable to use an inorganic film made of an inorganic material such as SiN, $SiO_2$, or the like as a protecting film 38, it is not limited to the inorganic film but a film made of an arbitrary material having excellent water proof and heat resistance may be used. As a construction of the protecting film 38, a single layer construction of the inorganic film or a construction in which the inorganic film and an organic film made of an organic resin or the like are laminated may be used. If the protecting film 38 has the laminated construction formed by a plurality of layers, as a specific construction of the laminated layer, a construction in which the inorganic film, organic film, and inorganic film are laminated in this order may be used. It is desirable from a viewpoint of moisture proof that the inorganic film which is formed as a protecting film 38 is formed by the method such as sputtering method, plasma CVD method, or the like.

Among the component elements of the organic EL displaying apparatus illustrated in FIG. 4A, the component elements which are not particularly disclosed in the above description can be formed by using the well-known materials by the well-known method.

Subsequently, the dimming method in the present embodiment will be described in detail. In the present embodiment, specifically describing, the dimming is performed by irradiating the laser beam from the downward direction of the substrate 30 to the members constructing the driving TFT 16b included in the bright-spot pixel detected in the display inspection. By irradiating the laser beam, a resistance of each member to which the laser beam has been irradiated rises. On the other hand, the driving TFT 16b is arranged on the wiring path from the power supply line 14 to the organic EL element 17. Therefore, since the current supply to the organic EL element 17 can be reduced by irradiating the laser beam, the dimming of the bright-spot pixel can be realized.

As described above, FIG. 4B illustrates the partial plane structure of the region of the AB interval in FIG. 4A and this structure is a plane structure of the driving TFT 16b illustrated in FIGS. 2A and 4A.

In the present embodiment, as illustrated in FIG. 4B, by irradiating the laser beam from the downward direction of the substrate to a predetermined plane region in the semiconductor layer 20 or near it, that is, to the region 26a or 26b, the dimming method of the present invention can be executed. The regions 26a and 26b are the regions which satisfy the following requirements (i), (ii), and (iii). Further, more desirably, they are regions which satisfy the following requirements (i), (ii), (iii), and (iv):

(i) region which overlaps the reflecting film 37 when seen as a plan view;
(ii) belt-shaped region which is arranged in the direction perpendicular to the current flowing direction of the semiconductor layer 20 and includes both ends of the semiconductor layer 20;
(iii) region which does not overlap the gate electrode 21 when seen as a plan view; and
(iv) region which does not overlap any of the source electrode 23, drain electrode 24, and other wiring layers such as a power supply line and the like.

In other words, the region of (iii) is a region where the semiconductor layer 20 can be directly seen and confirmed without being blocked by the gate electrode 21 when the semiconductor layer 20 is seen as a plan view. In other words, the region of (iv) is a region where the semiconductor layer 20 can be directly seen and confirmed without being blocked by any of the source electrode 23, drain electrode 24, and other wiring layers such as a power supply line and the like when the semiconductor layer 20 is seen as a plan view.

In the present embodiment, by irradiating the laser beam to the region 26a or 26b from the downward direction of the substrate, the dimming of the bright-spot pixel can be stably executed. The laser beam may be irradiated to the regions 26a and 26b. The reason why the laser beam is irradiated from the downward direction of the substrate is to prevent such a situation that by irradiating the laser beam from the upward direction of the substrate, the laser beam is irradiated to the second electrode 17c, so that the second electrode 17c is damaged.

In the present embodiment, as illustrated in FIGS. 4A and 4B, the laser beam is irradiated from the downward direction of the substrate to the region which overlaps the reflecting film 37 when seen as a plan view. By this method, the laser beam which reaches the protecting film 38 can be reduced and the damage of the protecting film 38 by the laser beam can be suppressed. Thus, the probability of occurrence of the defective display that is caused since the protecting film 38 is damaged, the moisture and oxygen penetrate therein, and the organic EL element deteriorates in this portion can be suppressed. Since the laser beam is irradiated from the downward direction of the substrate to the region which overlaps the reflecting film 37 when seen as a plan view, there is a case where the reflecting film 37 is deformed because the laser beam is irradiated to the reflecting film 37. If the deformation occurred in the reflecting film 37, the circuit construction changes, so that there is a case where even if the resistance of the semiconductor layer 20 of the TFT is raised, the dimming of the bright-spot pixel is not performed. In the present embodiment, since the insulating film 34 exists on the upper layer side of the TFT, the laser beam which reaches the reflecting film 37 can be reduced and a probability of occurrence of the deformation of the reflecting film 37 can be reduced. Even if the deformation occurred in the reflecting film 37, a probability that the reflecting film 37 and the semiconductor layer 20 are short-circuited can be decreased and a probability that the circuit construction changes can be reduced.

In the present embodiment, the laser beam is irradiated from the downward direction of the substrate to the region which does not overlap the gate electrode 21, more desirably, further, any of the source electrode 23, drain electrode 24, and other wiring layers such as a power supply line and the like when seen as a plan view. This is because it is intended to prevent the deformation or the like of the member itself which occurs since the laser beam is irradiated to the electrodes and the wiring layer. That is, there is a case where since the laser beam is irradiated to the respective electrodes and the wiring layer, the deformation or the like of the electrodes and the wiring layer itself occurs, so that the circuit construction changes and, accordingly, even if the resistance of the semiconductor layer 20 of the TFT is increased, the dimming of the bright-spot pixel is not performed. Therefore, it is intended to prevent such a situation as described above.

In the organic EL displaying apparatus having the pixel circuit illustrated in FIG. 2A, if the laser beam was irradiated to the region which overlaps the gate electrode 21 in the semiconductor layer 20 when seen as a plan view, the laser beam is irradiated to the gate electrode 21. Thus, there is a case where the gate electrode 21 and the drain electrode side of the semiconductor layer 20 are short-circuited. Consequently, the pixel to which the laser beam was irradiated becomes the pixel which is always turned on for the period of time of the emission period (C) during which the emission period controlling TFT 16c is ON, and the dimming of the bright-spot pixel cannot be performed. Therefore, in the present embodiment, the laser beam is irradiated to the region which satisfies at least the foregoing requirements (i), (ii), and (iii).

However, if the laser beam was irradiated to the region which satisfies the foregoing requirements (i), (ii), and (iii) but overlaps the source electrode 23, drain electrode 24, or other wiring layers (not illustrated in FIG. 4B) such as a power supply line and the like when seen as a plan view, a success ratio of the dimming decreases by the following reasons. In the organic EL displaying apparatus having the pixel circuit illustrated in FIG. 2A, the laser beam is irradiated to the region which overlaps the source electrode 23, drain electrode 24, or other wiring layers (not illustrated in FIG. 4B) such as a power supply line and the like in the semiconductor layer 20 when seen as a plan view. Therefore, the laser beam is irradiated to the source electrode 23, drain electrode 24, or other wiring layers such as a power supply line and the like. Thus, there is a case where those layers and the semiconductor layer 20 are short-circuited. Consequently, in the pixel to which the laser beam has been irradiated, the current flows in the short-circuited portion, the current is supplied to the organic EL element 17, and the dimming of the bright-spot pixel cannot be performed. Therefore, in the second embodiment, more desirably, the laser beam is irradiated to the region which satisfies the foregoing requirements (i), (ii), (iii), and (iv).

On the other hand, there is a case where even if the resistance of the semiconductor layer included in the TFT is increased, the dimming of the bright-spot pixel is not sufficiently performed due to the variation in shape of the TFT by the process variation, the variation in characteristics, or the variation in laser beam which is irradiated. To solve such a problem, the energy of the laser beam is increased. However, since the energy of the laser beam is increased, the foregoing problem of the short-circuit between the semiconductor layer and the gate electrode layer becomes more conspicuous. In addition, the problem of the short-circuit between the semiconductor layer and the source electrode, drain electrode, or other wiring layers such as a power supply line and the like becomes more conspicuous. Consequently, the laser beam is irradiated to the region which satisfies the foregoing requirements (i), (ii), and (iii), more desirably, to the region which satisfies the foregoing requirements (i), (ii), (iii), and (iv).

Although the semiconductor layer 20 included in the driving TFT 16b is used as a target in the present embodiment, the present invention is not limited to it. It is sufficient to use a TFT provided on the wiring path from the power supply line 14 to the organic EL element 17. In the organic EL displaying apparatus in the present embodiment, with respect to the semiconductor layer included in the emission period controlling TFT 16c, the laser beam may be irradiated to the region which satisfies the foregoing requirements (i), (ii), and (iii) and, more desirably, the foregoing requirements (i), (ii), (iii), and (iv).

Third Embodiment

Figure 5:
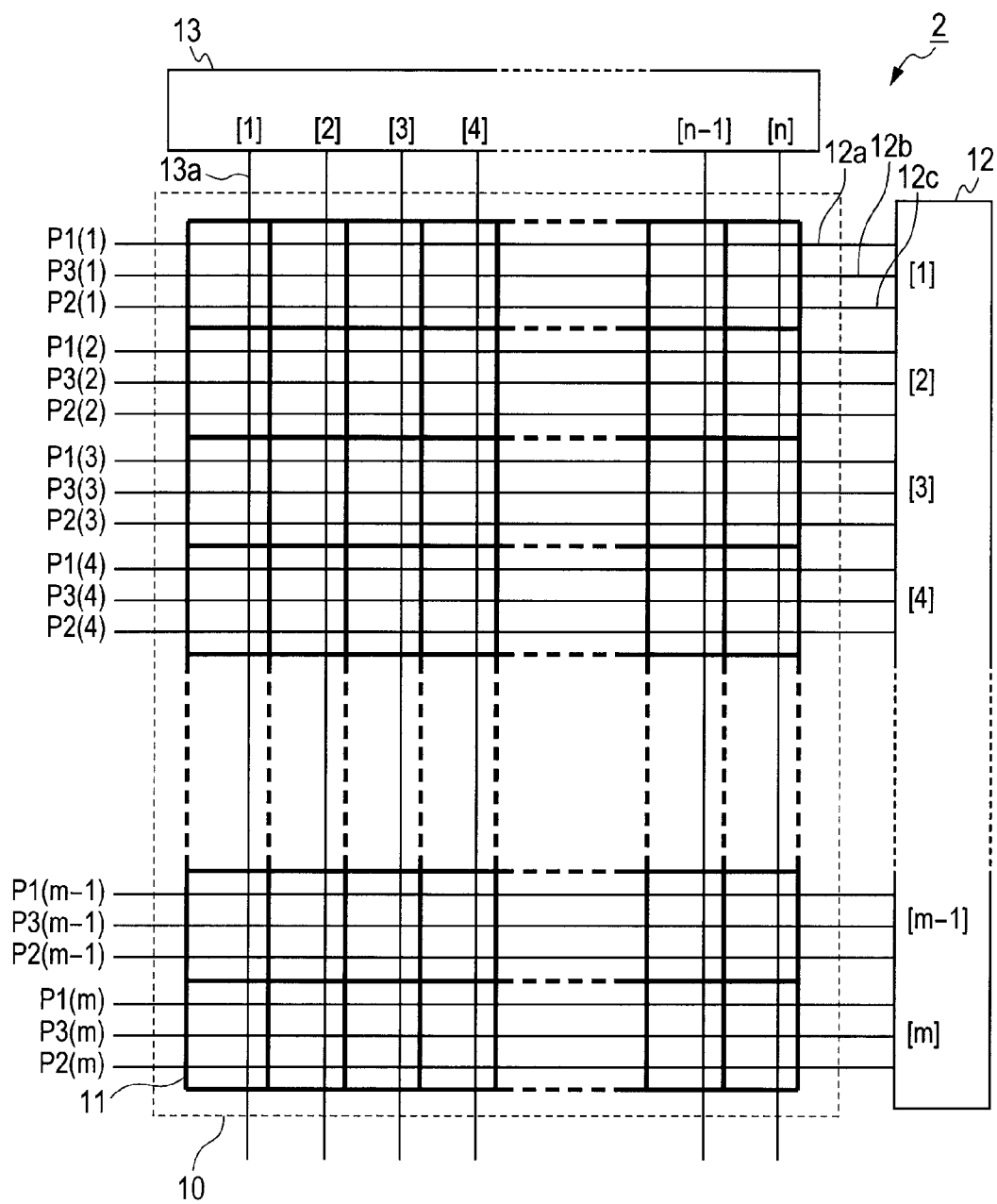
FIG. 5 is a diagram illustrating a wiring situation of an organic EL displaying apparatus of a third embodiment.

Subsequently, the third embodiment of the present invention will be described. FIG. 5 is a diagram illustrating a wiring situation of an organic EL displaying apparatus in the third embodiment. An organic EL displaying apparatus 2 of FIG. 5 has a construction similar to that of the organic EL displaying apparatus 1 in FIG. 1 except a point that there are three kinds of switching TFTs and there are three kinds of gate control signals in the organic EL displaying apparatus 1 of FIG. 1. According to the organic EL displaying apparatus 2 of FIG. 5, since the number of switching TFTs and the number of gate control signals are larger than those of the organic EL displaying apparatus 1 of FIG. 1, by lowering an influence which is exerted on displaying characteristics due to a variation in characteristics of the driving TFT of each pixel, the displaying characteristics are improved.

The third embodiment will be described in detail hereinbelow. In the organic EL displaying apparatus 2 of FIG. 5, members similar to those included in the organic EL displaying apparatus shown in the first embodiment are designated by the same reference numerals.

The organic EL displaying apparatus 2 of FIG. 5 has: the displaying region 10 in which the plurality of pixels 11 are arranged in a 2-dimensional form of m rows×n columns (m and n are natural numbers); and the row controlling circuit 12 and the column controlling circuit 13 which are arranged around the displaying region 10. The organic EL displaying apparatus 2 has a plurality of combinations each of which is constructed by the pixels 11R (not illustrated), 11G (not illustrated), and 11B (not illustrated) of three different hues of R (red), G (green), and B (blue).

Each pixel 11 in the displaying region is constructed by: an organic EL element, which will be described hereinafter; and a pixel circuit constructed by a TFT for controlling the current which is supplied to the organic EL element.

Three kinds of gate control signals P1(1) to P1(m), P2(1) to P2(m), and P3(1) to P3(m) are output from output terminals of the row controlling circuit 12, respectively. The gate control signal P1 is input to the pixel circuit of each row through the gate line 12a. The gate control signal P2 is input to the pixel circuit of each row through the gate line 12b. The gate control signal P3 is input to the pixel circuit of each row through the gate line 12c. The video signal is input to the column controlling circuit 13. The data voltage $V_{data}$ serving as gradation display data is output from each output terminal. A reference voltage $V_{sl}$ is also output from the column controlling circuit 13. Specifically describing, the data voltage $V_{data}$ as gradation display data and the reference voltage $V_{sl}$ are input to the pixel circuit of each column through the data line 13a. In the organic EL displaying apparatus 2 of FIG. 5, a data wiring to output the data voltage and a reference voltage line to output the reference voltage are set to different wirings and the connection may be successively switched over.

Figure 6A:
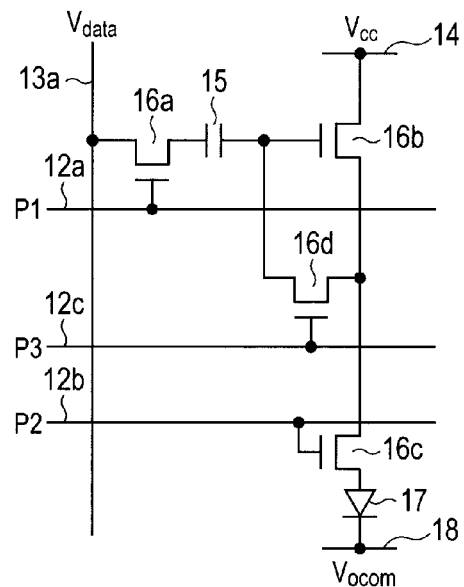
FIG. 6A is a circuit diagram of a pixel included in the organic EL displaying apparatus of FIG. 5.
Figure 6B:
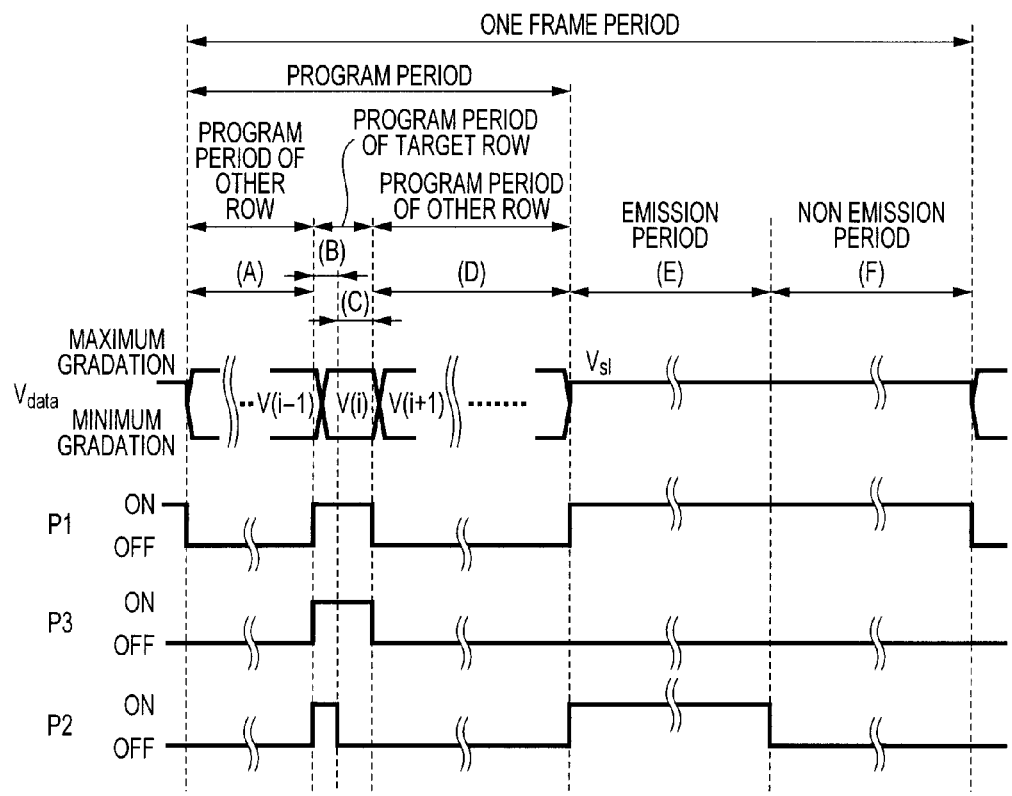
FIG. 6B is a diagram illustrating an example of a driving sequence of the circuit (pixel circuit) illustrated in FIG. 6A.

FIG. 6A is a circuit diagram of the pixel included in the organic EL displaying apparatus of FIG. 5. FIG. 6B is a diagram illustrating an example of a driving sequence of the circuit (pixel circuit) illustrated in FIG. 6A. In a manner similar to FIG. 5, members similar to those included in the organic EL displaying apparatus shown in the first embodiment are designated by the same reference numerals.

The pixel circuit of FIG. 6A is constructed by: three kinds of gate lines (12a, 12b, 12c); the data line 13a; the power supply line 14; the storage capacitor 15; four kinds of TFTs (16a, 16b, 16c, 16d); and the organic EL element 17. In the pixel circuit of FIG. 6A, the three kinds of gate lines correspond to the three kinds of gate lines 12a, 12b, and 12c illustrated in FIG. 5, respectively. In the pixel circuit of FIG. 6A, the four kinds of TFTs are the selecting TFT 16a, the driving TFT 16b, the emission period controlling TFT 16c (TFT for switching (switching TFT) provided on the wiring path from the power supply line to the organic EL element), and the TFT for erasing (erasing TFT) 16d. The selecting TFT 16a, emission period controlling TFT 16c, and erasing TFT 16d are the N-type TFTs. The driving TFT 16b is the P-type TFT.

In the selecting TFT 16a, the gate terminal is connected to the gate line 12a, the drain terminal is connected to the data line 13a, and the source terminal is connected to the storage capacitor 15, respectively. In the driving TFT 16b, the source terminal is connected to the power supply line 14 and the drain terminal is connected to a drain terminal of the erasing TFT 16d and the drain terminal of the emission period controlling TFT 16c, respectively. In the emission period controlling TFT 16c, the gate terminal is connected to the gate line 12b and the source terminal is connected to the anode of the organic EL element 17. In the erasing TFT 16d, a gate terminal is connected to the gate line 12c and a source terminal is connected to the gate terminal of the driving TFT 16b and the storage capacitor 15, and the drain terminal is connected to the drain terminal of the driving TFT 16b and the drain terminal of the emission period controlling TFT 16c, respectively. The cathode of the organic EL element 17 is connected to the grounding line 18.

An example of the driving sequence of the pixel circuit of the organic EL displaying apparatus 2 of the present embodiment will be described with reference to FIG. 6B. In FIG. 6B, the following periods (A) to (F) are included in one frame period. In FIG. 6B, among the periods (A) to (F), the periods (A) to (D) are program periods. The program period is a period of time during which programming is performed to all rows and is constructed by: a program period (period (B), period (C)) of a target row during which the gradation display data is written into a target pixel; and a program period (period (A), period (D)) of other row during which the gradation display data is written into pixels other than the target row.

Period (A): Program period of other row (before the target row);

Period (B): Discharging period (program period of the target row);

Period (C): Writing period (program period of the target row);

Period (D): Program period of other row (after the target row);

Period (E): Emission period; and

Period (F): Non emission period.

In FIG. 6B, V(i−1), V(i), and V(i+1) indicate the data voltages $V_{data}$ which are input to the pixel circuit of the (i−1)th row (one-precedent row of the target row), the ith row (target row), and the (i+1)th row (one-subsequent row of the target row) in the one frame period of the target column, respectively.

Subsequently, the periods (A) to (F) illustrated in FIG. 6B will be described in detail.

(1) Period (A): Program period of other row (before the target row)

In the period (A), in the pixel circuit of the target row, since the low level signal is input to the gate line 12a, the selecting TFT 16a is OFF. Since low level signal is input to the gate line 12c, the erasing TFT 16d is OFF. In this state, the data voltage $V_{data}$ as gradation display data regarding the precedent row is not input to the pixel circuit of the ith row as a target row.

(2) Period (B): Discharging Period

In the period (B), since the high level signal is input to the gate lines 12a, 12b, and 12c, the selecting TFT 16a, erasing TFT 16d, and emission period controlling TFT 16c are ON. The data voltage V(i) as gradation display data of the relevant row is set into the data line 13a and the data voltage V(i) is input to the data line side of the storage capacitor 15. At this time, the erasing TFT 16d is turned on. Therefore, the gate terminal of the driving TFT 16b and the grounding line 18 are connected through the organic EL element 17. The gate voltage of the driving TFT 16b becomes a voltage near grounding line potential $V_{ocom}$ irrespective of the voltage in the state just before. The driving TFT 16b is turned on.

(3) Period (C): Writing Period

In the period (C), since the low level signal is input to the gate line 12b, the emission period controlling TFT 16c is OFF. Thus, the current flows from the drain terminal of the driving TFT 16b to the gate terminal and a voltage between the gate and source of the driving TFT 16b approaches a threshold voltage of the driving TFT 16b. The gate voltage of the driving TFT 16b at this time is input to the side of the storage capacitor 15 connected to the gate terminal of the driving TFT. Subsequent to the period (B), the data voltage V(i) as gradation display data of the relevant row has been set into the data line 12a. The data voltage V(i) is input to the data line side of the storage capacitor 15. In this manner, electric charges corresponding to the voltage of a difference between the gate voltage of the driving TFT 16b and the data voltage V(i) are charged into the storage capacitor 15. The programming of the gradation display data is performed.

(4) Period (D): Program Period of Other Row (after the Target Row)

In the period (D), the low level signal is input to the gate lines 12a and 12c and the selecting TFT 16b and the erasing TFT 16d are OFF. Therefore, the electric charges charged in the storage capacitor 15 for the period (C) are maintained even if the voltage of the data line changed to the data voltage $V_{data}$ as gradation display data regarding the subsequent row.

(5) Period (E): Emission Period

In the period (E), the high level signal is input to the gate line 12a and the selecting TFT 16b is ON. The reference voltage $V_{sl}$ is set into the data line 13a. Therefore, the reference voltage $V_{sl}$ is input to the data line side of the storage capacitor 15. For this period of time, since the erasing TFT 16d is OFF, the electric charges charged in the storage capacitor 15 for the period (C) are maintained. Thus, the gate voltage of the driving TFT changes by an amount corresponding to a difference between the data voltage V(i) and the reference voltage $V_{sl}$.

On the other hand, the high level signal is input to the gate line 12a after the period (D), that is, for a time interval between the period (E) and the period (F). The low level signal is input to the gate line 12c after the period (D), that is, for a time interval between the period (E) and the period (F). Therefore, the ON state of the selecting TFT 16a and the OFF state of the erasing TFT 16d are maintained for a time interval between the periods (E) and (F). Therefore, the gate voltage of the driving TFT 16b is maintained to a predetermined voltage for a time interval between the periods (E) and (F).

In the period (E), the high level signal is input to the gate line 12b and the emission period controlling TFT 16c is turned on. Therefore, the current according to the gate voltage of the driving TFT 16b is supplied to the organic EL element 17 and the organic EL element 17 emits the light at luminance of the gradation according to the supplied current.

(6) Period (F): Non Emission Period

In the period (F), the low level signal is input to the gate line 12b and the emission period controlling TFT 16c is turned off. Therefore, the organic EL element 17 does not emit the light for the period (F).

Figure 7A:
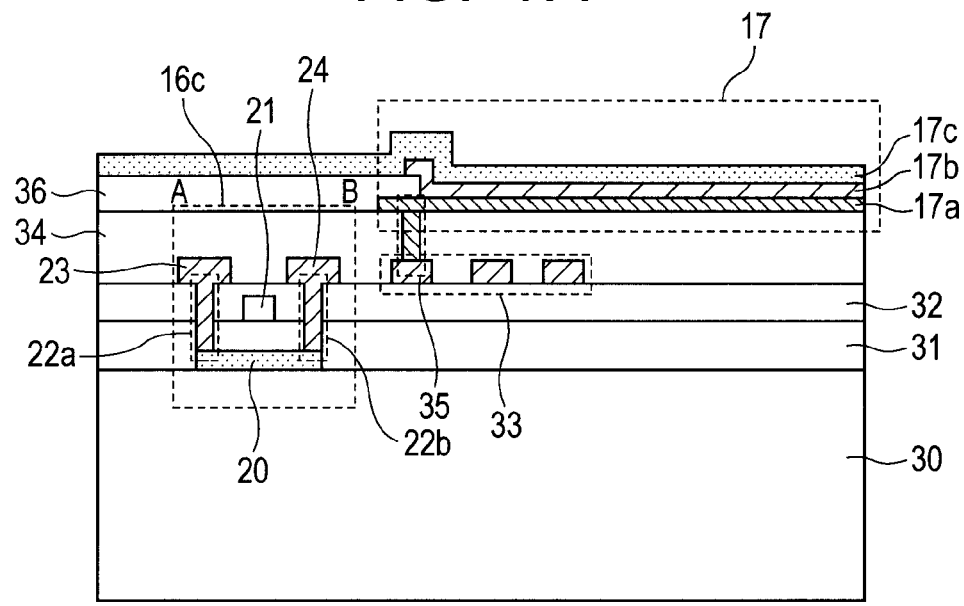
FIG. 7A is a schematic cross sectional view illustrating the organic EL displaying apparatus of FIG. 5.

FIG. 7A is a schematic cross sectional view illustrating the organic EL displaying apparatus of FIG. 5.

Figure 7B:
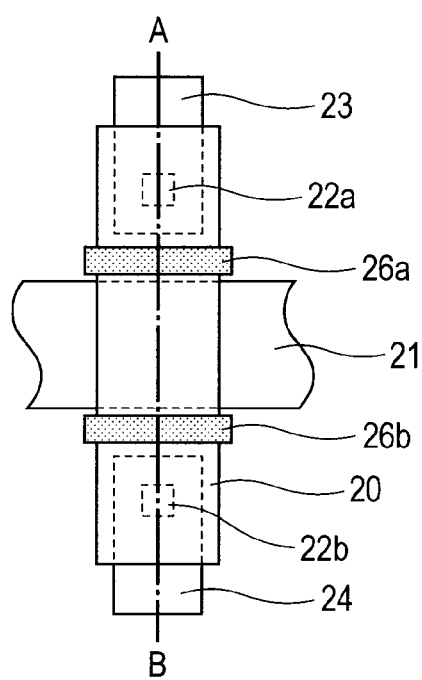
FIG. 7B is a schematic diagram illustrating a partial plane structure of a region of an AB interval in FIG. 7A.

FIG. 7B is a schematic diagram illustrating a partial plane structure of a region (emission period controlling TFT 16c) of an AB interval in FIG. 7A and is a diagram seen from the downward direction of the substrate. In a manner similar to FIG. 5, members similar to those included in the organic EL displaying apparatus shown in the first embodiment are designated by the same reference numerals. Although not illustrated, the gate electrode 21 is electrically connected to the gate line 12b.

FIG. 7A illustrates a cross sectional structure including the emission period controlling TFT 16c as a part of the organic EL displaying apparatus of FIG. 5.

In the present embodiment, the laser beam is irradiated to the emission period controlling TFT 16c as a TFT which is closest on the circuit to the organic EL element 17. The emission period controlling TFT 16c is arranged on the wiring path from the power supply line 14 to the organic EL element 17. Therefore, by irradiating the laser beam from the downward direction of the substrate 30 and increasing the resistance of the semiconductor layer 20, the current supply to the organic EL element 17 can be reduced. Therefore, the dimming of the bright-spot pixel can be performed.

Subsequently, the dimming method in the present embodiment will be described in detail.

As described above, FIG. 7B illustrates a partial plane structure of a region of an AB interval in FIG. 7A. This structure is a plane structure of the emission period controlling TFT 16c illustrated in FIGS. 6A and 7A.

In the present embodiment, as illustrated in FIG. 7B, by irradiating the laser beam from the downward direction of the substrate to a predetermined region 26a or 26b in the semiconductor layer 20 or near it, the dimming method of the present invention can be executed. Requirements about the regions 26a and 26b are similar to those in the first embodiment and they are the regions which satisfy the requirements (i) and (ii) shown in the first embodiment. Further, more desirably, they are the regions which satisfy the requirements (i), (ii), and (iii) shown in the first embodiment.

In the present embodiment, by irradiating the laser beam to the region 26a or 26b from the downward direction of the substrate, the dimming of the bright-spot pixel can be stably performed and the influence on the display of the adjacent pixel can be reduced. The laser beam may be irradiated to the regions 26a and 26b. In a manner similar to the first embodiment, the reason why the laser beam is irradiated from the downward direction of the substrate is to prevent such a situation that the second electrode 17c is damaged since the laser beam is irradiated to the second electrode 17c. Even in the case where the organic EL element 17 is of the top emission type and the emission period controlling TFT 16c is arranged in the region which overlaps the first electrode 17a having the light reflecting property when seen as a plan view, by irradiating the laser beam from the downward direction of the substrate, the laser beam can be irradiated to the region 26a or 26b.

The reason why the laser beam is irradiated to the region which does not overlap the gate electrode 21, more desirably, further, any of the source electrode 23, drain electrode 24, and other wiring layers such as a power supply line and the like when seen as a plan view is to prevent the deformation or the like of the members as they are which is caused since the laser beam is irradiated to the respective electrodes and the wiring layer. That is, there is a case where since the laser beam is irradiated to the respective electrodes and the wiring layer, a deformation or the like of the electrodes and the wiring layer itself occurs, so that the circuit construction changes and, accordingly, even if the resistance of the semiconductor layer 20 included in the TFT is increased, the dimming of the bright-spot pixel is not performed. Therefore, it is intended to prevent such a situation as described above. On the other hand, there is a case where since the laser beam is irradiated to the gate electrode 21, a deformation or the like of the gate electrode occurs, so that a defective transmission of the gate signal via the gate line 12b occurs, and an influence is exerted on the display of the adjacent pixel. Therefore, it is intended to prevent such a situation as described above.

In the organic EL displaying apparatus having the pixel circuit illustrated in FIG. 6A, if the laser beam was irradiated to the region which overlaps the gate electrode 21 in the semiconductor layer 20 when seen as a plan view, the laser beam is irradiated to the gate electrode 21. Thus, there is a case where the gate electrode 21 and the semiconductor layer 20 are short-circuited. Consequently, the current is supplied from the gate electrode 21 to the organic EL element 17 through the short-circuited portion and the dimming of the bright-spot pixel cannot be performed. There is a case where the gate electrode 21 is damaged by the laser beam. Thus, a defective transmission of the gate signal via the gate line 12b occurs and there is a case where an influence is exerted on the display of the adjacent pixel. Therefore, in the dimming method of the present invention, the laser beam is irradiated to the region which satisfies the requirements (i) and (ii) shown in the first embodiment.

If the laser beam was irradiated to the region which satisfies the requirements (i) and (ii) shown in the first embodiment but overlaps the source electrode 23, drain electrode 24, or other wiring layers (not illustrated in FIG. 7B) such as a power supply line and the like when seen as a plan view, a success ratio of the dimming decreases by the following reasons.

In the organic EL displaying apparatus having the pixel circuit illustrated in FIG. 6A, the laser beam is irradiated to the region which overlaps the source electrode 23, drain electrode 24, or other wiring layers (not illustrated in FIG. 7B) such as a power supply line and the like in the semiconductor layer 20 when seen as a plan view. Therefore, the laser beam is irradiated to the source electrode 23, drain electrode 24, or other wiring layers such as a power supply line and the like. Thus, there is a case where those layers and the semiconductor layer 20 are short-circuited. Consequently, in the pixel to which the laser beam has been irradiated, the current flows in the short-circuited portion, the current is supplied to the organic EL element 17, and the dimming of the bright-spot pixel cannot be performed. Therefore, according to the dimming method of the present invention, more desirably, the laser beam is irradiated to the region which satisfies the requirements (i), (ii), and (iii) shown in the first embodiment.

On the other hand, there is a case where even if the resistance of the semiconductor layer included in the TFT is increased, the dimming of the bright-spot pixel is not sufficiently performed due to the variation in shape of the TFT by the process variation, the variation in characteristics, or the variation in laser beam which is irradiated. To solve such a problem, the energy of the laser beam is increased. However, since the energy of the laser beam is increased, the foregoing problems of the short-circuit between the semiconductor layer and the gate electrode layer and the damage of the gate wiring layer become more conspicuous. In addition, the problem of the short-circuit between the semiconductor layer and the source electrode, drain electrode, or other wiring layers such as a power supply line and the like becomes more conspicuous. Consequently, it is desirable to irradiate the laser beam to the region which satisfies the requirements (i) and (ii) shown in the first embodiment, more desirably, to the region which satisfies the requirements (i), (ii), and (iii).

In the present embodiment, the laser beam is irradiated to the emission period controlling TFT 16c which is closer to the organic EL element 17 on the circuit than the driving TFT 16b. Therefore, even if a defective pattern such as a short-circuit or the like between the wirings with the power supply line or the like occurred in the wiring portion between the driving TFT 16b and the emission period controlling TFT 16c, the current supply to the organic EL element 17 can be reduced. Thus, the dimming of the bright-spot pixel can be performed.

In the present embodiment, a laser similar to that in the first embodiment can be used as a laser which is used when executing the dimming method. As for an irradiation width of the laser beam as well, in a manner similar to the first embodiment, it is desirable to set the width to a value which is equal to or larger than about the wavelength of the laser beam in the direction parallel with the current flowing direction of the semiconductor layer 20. Further, it is more desirable to set the width to about 1 μm or more, much desirably, about 2 μm or less. In addition, as for the separation interval between the gate electrode and the source electrode 23 or between the gate electrode 21 and the drain electrode 24, in a manner similar to the first embodiment, it is also desirable to provide the separation interval which is equal to or larger than the value in which the irradiation width of the laser beam and the positioning tolerance of the laser beam irradiating apparatus are matched.

Also with respect to the laser beam irradiating portion, in a manner similar to the first embodiment, it is desirable to irradiate the laser beam only to one of the regions 26a and 26b. Consequently, in the regions 26a and 26b, with respect to the region to which the laser beam is not irradiated, there is no need to provide the separation interval between the gate electrode 21 and the source electrode 23 or between the gate electrode 21 and the drain electrode 24 and the layout space can be decreased. The number of times of irradiation of the laser beam can be decreased and a time which is required for dimming can be shortened.

If there are a plurality of plane regions (for example, the regions 26a and 26b in FIG. 7B) in each of which the semiconductor layer 20 to which the laser beam can be irradiated is provided like the present embodiment, desirably, the laser beam is irradiated only to the plane region that is closest to the organic EL element 17 on the circuit. Specifically describing in FIG. 7B, it is desirable to irradiate the laser beam only to the region 26a which is closer to the organic EL element 17 on the circuit and is arranged between the gate electrode 21 and the drain electrode 23. By using such a method, even if there is a defective pattern between the regions 26a and 26b, the current supply to the organic EL element 17 can be reduced. For example, in the region where the gate electrode 21 and the semiconductor layer 20 overlap when seen as a plan view, if there is a defect in the gate insulating film 31 and such a defective pattern that the gate electrode 21 and the semiconductor layer 20 are short-circuited, the current is supplied from the gate electrode 21 to the organic EL element 17 and such a pixel becomes the bright-spot pixel. Even in such a case, by irradiating the laser beam only to the region 26a between the gate electrode 21 and the source electrode 23, the resistance of the region which is closer to the organic EL element 17 on the circuit than the short-circuited portion can be raised. Therefore, the dimming of the bright-spot pixel can be performed. An alignment method to the emission period controlling TFT 16c which the bright-spot pixel has can be also performed by a method similar to that in the first embodiment.

Although the semiconductor layer 20 included in the emission period controlling TFT 16c is used as a target in the present embodiment, the present invention is not limited to it. With respect to the semiconductor layer included in the driving TFT 16b, the laser beam may be irradiated to the region which satisfies the requirements (i) and (ii) shown in the first embodiment, more desirably, to the region which satisfies the requirements (i), (ii), and (iii) shown in the first embodiment.

Fourth Embodiment

Figure 8A:
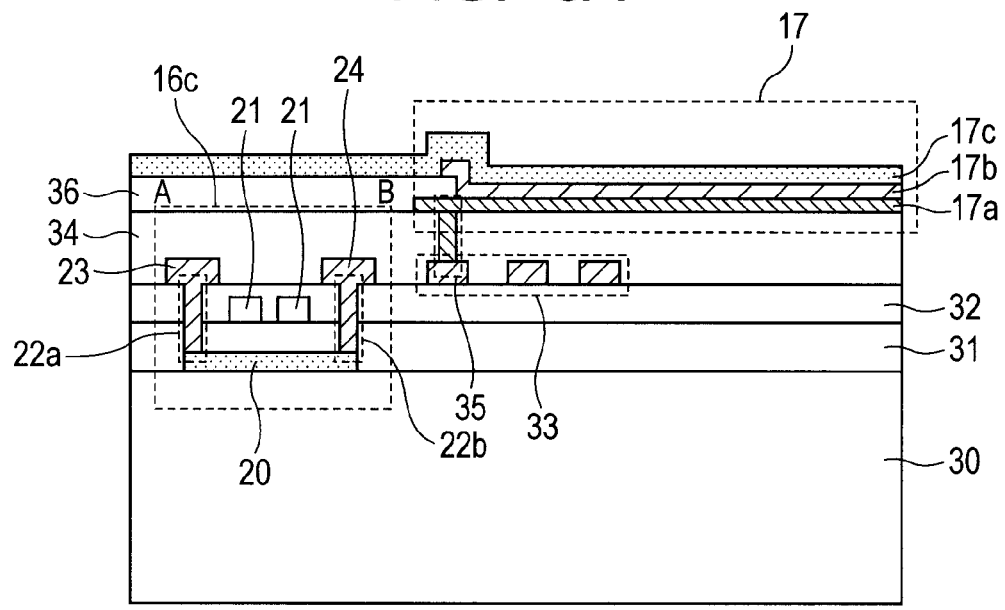
FIG. 8A is a schematic cross sectional view illustrating an organic EL displaying apparatus of a fourth embodiment.
Figure 8B:
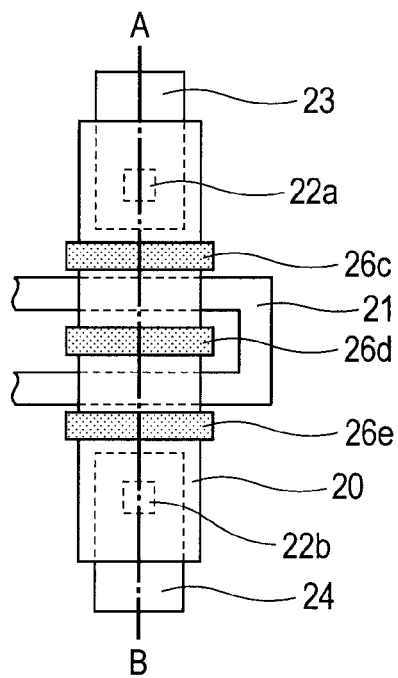
FIG. 8B is a schematic diagram illustrating a partial plane structure of a region of an AB interval in FIG. 8A.

The fourth embodiment of the present invention will be described hereinbelow. FIG. 8A is a schematic cross sectional view illustrating an organic EL displaying apparatus in the present embodiment. FIG. 8B is a schematic diagram illustrating a partial plane structure of a region of an AB interval in FIG. 8A and is a diagram when seen from the downward direction of the substrate. In the organic EL displaying apparatus in FIGS. 8A and 8B, members similar to those included in the organic EL displaying apparatus shown in the first embodiment are designated by the same reference numerals. The present embodiment relates to the organic EL displaying apparatus having a circuit construction similar to that of the organic EL displaying apparatus 2 of FIG. 5. That is, the present embodiment relates to the organic EL displaying apparatus, as a target, having a construction in which the emission period controlling TFT is constructed by connecting a plurality of TFTs in series and gate electrodes of the plurality of TFTs are constructed by a common electrode. Therefore, the organic EL displaying apparatus of the present embodiment has substantially the same construction as that of the third embodiment except that the construction of the emission period controlling TFT differs as described above. A driving sequence is also substantially the same construction as that of the third embodiment. The gate electrode 21 is electrically connected to the gate line 12b although not illustrated.

FIG. 8A illustrates a cross sectional structure including the emission period controlling TFT 16c as a part of the organic EL displaying apparatus of the present embodiment. In the present embodiment, in a manner similar to the third embodiment, the laser beam is irradiated to the emission period controlling TFT 16c as a TFT which is closest on the circuit to the organic EL element 17. The emission period controlling TFT 16c is arranged on the wiring path from the power supply line 14 to the organic EL element 17. Therefore, by irradiating the laser beam from the downward direction of the substrate and increasing the resistance of the semiconductor layer 20, the current supply to the organic EL element 17 can be reduced, so that the dimming of the bright-spot pixel can be performed.

Subsequently, the dimming method in the present embodiment will be described in detail.

As described above, FIG. 8B illustrates a partial plane structure of a region of an AB interval in FIG. 8A. This structure is a plane structure in the pixel circuit of the third embodiment and of the emission period controlling TFT 16c illustrated in FIG. 8A.

In the organic EL displaying apparatus of the present embodiment, the emission period controlling TFT 16c has the construction in which a plurality of TFTs are connected in series and the gate electrodes of the plurality of TFTs are common. That is, as illustrated in FIG. 8B, the gate electrode 21 is arranged between the source electrode 23 and the drain electrode 24 and this gate electrode 21 multi-level crosses the semiconductor layer 20 at a plurality of positions (two positions).

In the present embodiment, as illustrated in FIG. 8B, by irradiating the laser beam from the downward direction of the substrate to predetermined regions 26c to 26e in the semiconductor layer 20 or near it, the dimming method of the present invention can be executed. The regions 26c and 26e are the regions which satisfy the following requirements (i) and (ii). Further, more desirably, they are the regions which satisfy the following requirements (i), (ii), and (iii):

(i) belt-shaped region which is arranged in the direction perpendicular to the current flowing direction of the semiconductor layer 20 and includes both ends of the semiconductor layer 20;

(ii) region which does not overlap the gate electrode 21 when seen as a plan view (however, the region corresponding to a requirement (iv), which will be described hereinafter, is excluded); and (iii) region which does not overlap any of the source electrode 23, drain electrode 24, and other wiring layers such as a power supply line and the like when seen as a plan view.

On the other hand, the region 26d is a region which satisfies the requirements (i) and (iv). Further, more desirably, it is a region which satisfies the requirements (i), (iv), and (iii):

(iv) region which does not overlap the gate electrode 21 when seen as a plan view and is arranged between the multi-level crossing positions of the semiconductor layer 20 and the gate electrode 21 to the current flowing direction of the semiconductor layer 20.

In the present embodiment, by irradiating the laser beam to the region 26c, 26d, or 26e from the downward direction of the substrate, the dimming of the bright-spot pixel can be stably executed and the influence on the display of the adjacent pixel can be reduced. The laser beam may be irradiated to the two kinds of regions among the regions 26c to 26e. The laser beam may be irradiated to all of the regions 26c to 26e. In the present embodiment, desirably, the laser beam is irradiated to the region 26d. Thus, the laser beam can be stably irradiated.

In a manner similar to the first and second embodiments, the reason why the laser beam is irradiated from the downward direction of the substrate is to prevent such a situation that the second electrode 17c is damaged since the laser beam is irradiated to the second electrode 17c. Even in the case where the organic EL element 17 is of the top emission type and the emission period controlling TFT 16c is arranged in the region which overlaps the first electrode 17a having the light reflecting property when seen as a plan view, by irradiating the laser beam from the downward direction of the substrate, the laser beam can be irradiated to the region 26*c*, 26*d*, or 26*e*.

The reason why the laser beam is irradiated to the region which does not overlap the gate electrode 21, more desirably, further, any of the source electrode 23, drain electrode 24, and other wiring layers (not illustrated in FIG. 8B) such as a power supply line and the like when seen as a plan view is to prevent a deformation or the like of the members as they are that is caused since the laser beam is irradiated to the respective electrodes and the wiring layer. That is, there is a case where since the laser beam is irradiated to the respective electrodes and the wiring layer, the deformation or the like of the members occurs, so that the circuit construction changes and, accordingly, even if the resistance of the semiconductor layer 20 of the TFT is increased, the dimming of the bright-spot pixel is not performed. Therefore, it is intended to prevent such a situation as described above. In addition, there is a case where since the laser beam is irradiated to the gate electrode 21, the deformation or the like of the gate electrode occurs, so that a defective transmission of the gate signal via the gate line 12*b* occurs and an influence is exerted on the display of the adjacent pixel. Therefore, it is intended to prevent such a situation as described above.

In the organic EL displaying apparatus having the pixel circuit illustrated in FIG. 6A, if the laser beam was irradiated to the region which overlaps the gate electrode 21 in the semiconductor layer 20 when seen as a plan view, the laser beam is irradiated to the gate electrode 21. Thus, there is a case where the gate electrode 21 and the semiconductor layer 20 are short-circuited. Consequently, the current flows from the gate electrode 21 to the organic EL element 17 through the short-circuited portion and the dimming of the bright-spot pixel cannot be performed. On the other hand, there is a case where the gate electrode 21 is damaged by the laser beam. Thus, a defective transmission of the gate signal via the gate line 12*b* occurs and an influence is exerted on the display of the adjacent pixel. Therefore, according to the dimming method of the present invention, the laser beam is irradiated to the region which satisfies the foregoing requirements (i) and (ii) or the region which satisfies the foregoing requirements (i) and (iv).

If the laser beam was irradiated to the region which satisfies the foregoing requirements (i) and (ii) but overlaps the source electrode 23, drain electrode 24, or other wiring layers (not illustrated in FIG. 8B) such as a power supply line and the like when seen as a plan view, the success ratio of the dimming decreases by the following reasons.

In the organic EL displaying apparatus having the pixel circuit illustrated in FIG. 6A, the laser beam is irradiated to the region which overlaps the source electrode 23, drain electrode 24, or other wiring layers (not illustrated in FIG. 8B) such as a power supply line and the like in the semiconductor layer 20 when seen as a plan view. Therefore, the laser beam is irradiated to the source electrode 23, drain electrode 24, or other wiring layers such as a power supply line and the like. Thus, there is a case where those layers and the semiconductor layer 20 are short-circuited. In such a case, in the pixel to which the laser beam was irradiated, the current flows in the short-circuited portion, the current is supplied to the organic EL element 17, and the dimming of the bright-spot pixel cannot be performed. Even in the case where the laser beam was irradiated to the region which satisfies the foregoing requirements (i) and (iv) but overlaps the source electrode 23, drain electrode 24, or other wiring layers such as a power supply line and the like when seen as a plan view, the success ratio of the dimming also decreases by reasons similar to those described above. Therefore, according to the dimming method of the present embodiment, more desirably, the laser beam is irradiated to the region which satisfies the foregoing requirements (i), (ii), and (iii) or the region which satisfies the foregoing requirements (i), (iv), and (iii).

On the other hand, there is a case where even if the resistance of the semiconductor layer included in the TFT is increased, the dimming of the bright-spot pixel is not sufficiently performed due to the variation in shape of the TFT by the process variation, the variation in characteristics, or the variation in laser beam which is irradiated. To solve such a problem, the energy of the laser beam is increased. However, since the energy of the laser beam is increased, the foregoing problems of the short-circuit between the semiconductor layer and the gate electrode layer and the damage of the gate wiring layer becomes more conspicuous. In addition, the problem of the short-circuit between the semiconductor layer and the source electrode, drain electrode, or other wiring layers such as a power supply line and the like becomes more conspicuous. Consequently, it is desirable to irradiate the laser beam to the region which satisfies the foregoing requirements (i) and (ii) or the region which satisfies the foregoing requirements (i) and (iv), more desirably, to the region which satisfies the foregoing requirements (i), (ii), and (iii) or the region which satisfies the foregoing requirements (i), (iv), and (iii).

In the organic EL displaying apparatus of the present embodiment, the region where the semiconductor layer 20 does not overlap the gate electrode 21 when seen as a plan view is provided between the semiconductor layer 20 and the gate electrode 21 which multi-level crosses it. Therefore, in the dimming method of the present embodiment, in the structure in which the laser beam is irradiated only to the region 26*d*, there is no need to provide the separation interval between the source electrode 23 and the gate electrode 21 or between the drain electrode 24 and the gate electrode 21 in the direction parallel with the current flowing direction of the semiconductor layer 20. Thus, the layout space can be reduced.

In the organic EL displaying apparatus of the present embodiment, since the emission period controlling TFT has a construction in which a plurality of TFTs are connected in series and the gate electrodes of the plurality of TFTs are constructed by the common electrode, the following effects are obtained. The effects will now be described.

There is a case where static electricity during the manufacturing step of the TFT occurs, when an edge of the gate electrode and a grain boundary of an active layer coincide, a carrier transportation through a level at the grain boundary occurs, or the like, so that the resistance at the time of turn-off of the TFT decreases. In the organic EL displaying apparatus of the third embodiment, when the resistance at the time of turn-off of the emission period controlling TFT 16*c* decreases, the large current flows for the period (D) of the driving sequence and the defective bright-spot occurs.

In the organic EL displaying apparatus of the present embodiment, the emission period controlling TFT 16*c* has such a construction that a plurality of TFTs are connected in series and the gate electrodes of the plurality of TFTs are common. Therefore, even when the resistance of one of the TFTs has decreased at the time of turn-off as described above, if another TFT is normally operating, a desired value can be assured as a combined resistance of each resistance between the source electrode and the drain electrode at the time of turn-off of the plurality of TFTs constructing the emission period controlling TFT. As described above, in the organic EL displaying apparatus of the present embodiment, a probability of occurrence of the defective bright-spot can be suppressed. As described above, the displaying characteristics upon driving for controlling the emission period can be improved.

The pixel circuits and driving sequences illustrated in FIGS. 2A, 2B, 6A, and 6B are specific examples of the pixel circuit included in the target organic EL displaying apparatus as a target to which the dimming method of the present invention is applied and its driving sequence. The target to which the dimming method of the present invention is applied is not limited to the organic EL displaying apparatus which includes those pixel circuits and is driven by those driving sequences.

[Organic EL Displaying Apparatus]

In the organic EL displaying apparatus to which the dimming method of the organic EL displaying apparatus described above has been applied, since the dimming of the bright-spot pixel is performed, the displaying characteristics in which the defective bright-spot has been restored can be obtained.

Example 1

An example of the dimming method of the second embodiment will be described hereinbelow. The present invention is not limited to the example, which will be described hereinafter. The present invention is not limited by materials, element constructions, pixel arrangements, and pixel pitches used in the examples, which will be described hereinafter.

In this example, a 2-dimensional arrangement of the pixels 11 in FIG. 1 is set to an arrangement of 480 rows×1920 columns. A pixel pitch in the row direction of the pixels 11 is set to 94.5 μm and a pixel pitch in the column direction is set to 31.5 μm. The pixels 11 is constructed in such a manner that the pixels 11R (not illustrated), 11G (not illustrated), and 11B (not illustrated) are repetitively arranged in this order in the column direction. The organic EL displaying apparatus is manufactured based on such a pixel arrangement and a pixel pitch. In this example, first, the semiconductor layer 20, gate insulating film 31, gate electrode 21, interlayer insulating film 32, source electrode 23, drain electrode 24, and wirings 33 are sequentially formed onto the substrate 30 by using the well-known process.

Specifically describing, first, a polysilicon film is formed in a predetermined region and the semiconductor layer 20 is formed. At this time, a film thickness of the semiconductor layer 20 is set to 40 nm. Subsequently, an $SiO_2$ film is formed and the gate insulating film 31 is formed. At this time, a thickness of the gate insulating film 31 is set to 100 nm. Then, an MoW film is formed in a predetermined region and the gate electrode 21 is formed. At this time, a thickness of the gate electrode is set to 150 nm. Subsequently, an SiO film is formed and the interlayer insulating film 32 is formed. At this time, a thickness of the interlayer insulating film 32 is set to 500 nm. Then, a Ti film and an Al film are sequentially formed in order of Ti (film thickness: 100 nm)/Al (film thickness: 300 nm)/Ti (film thickness: 100 nm) from the lower layer. After that, by performing desired patterning, the source electrode 23, drain electrode 24, and wirings 33 are formed in a lump.

Subsequently, a polyimide resin is coated onto the source electrode 23, drain electrode 24, and wirings 33 and, thereafter, the patterning is performed by using the photolithography method, thereby forming the insulating film 34 in which the contact hole 35 has been formed at a desired position. A thickness of the insulating film 34 after the baking is equal to 2 μm.

Subsequently, an Ag film is formed onto the insulating film 34 by using the sputtering method. At this time, a thickness of the Ag film is set to 150 nm. Then, by performing the patterning of the Ag film by using the photolithography method, the reflecting film 37 is formed.

Subsequently, an indium zinc oxide film having a thickness of 10 nm is formed and by performing the patterning by using the photolithography method, the first electrode 17a is formed.

Subsequently, while covering the contact hole 35, the bank 36 is formed onto the first electrode 17a formed on the insulating film 34 so as to have an opening portion. Specifically describing, after the polyimide resin was coated, by performing the desired patterning by using the photolithography method, the bank 36 is formed. A film thickness of the bank 36 after the baking is equal to 1.5 μm.

Subsequently, the organic EL layer 17b made of the well-known material is formed onto the bank 36 by using a mask evaporation deposition method.

Then, an indium zinc oxide film is formed onto the organic EL layer 17b with respect to the whole displaying region 10 by using the sputtering method, thereby forming the second electrode 17c. A film thickness of the second electrode 17c is equal to 30 nm.

Subsequently, the protecting film 38 is formed onto the second electrode 17c with respect to the whole displaying region 10. The protecting film 38 is constructed by the following three layers. First, an SiN film having a thickness of 1 μm is formed onto the second electrode 17c by using the plasma CVD method. Then, an organic resin having a thickness of 10 μm is formed onto the SiN film. Then, an SiN film having a thickness of 1 μm is formed onto the organic resin by using the plasma CVD method.

A plurality of organic EL displaying apparatuses are manufactured by the above steps.

Subsequently, the plurality of manufactured organic EL displaying apparatuses are turned on, the display inspection is performed, and the organic EL displaying apparatuses in which the defective bright-spots occurred are extracted. The dimming method of the present invention is applied to the defective bright-spot pixels among the plurality of manufactured organic EL displaying apparatuses in which the defective bright-spots occurred.

In the present embodiment, the laser beam is irradiated to the region 26b in FIG. 4B for the driving TFT 16b from the downward direction of the substrate 30 by using the YAG laser having a wavelength of 532 nm. That is, the laser beam is irradiated to the region which satisfies the requirements (i), (ii), (iii), and (iv) described in the second embodiment.

After the laser beam was irradiated, the organic EL displaying apparatuses are turned on again, the display inspection is performed, the light emitting state at the position of the bright-spot pixel is confirmed, and ten organic EL displaying apparatuses in which the dimming of all of the defective bright-spot pixels in the organic EL displaying apparatus has been performed are extracted. In those organic EL displaying apparatuses, one to five bright-spot pixels whose dimming has been performed are included in each organic EL displaying apparatus.

Those ten organic EL displaying apparatuses are left for 5000 hours. After that, those organic EL displaying apparatuses are turned on again and the display inspection is performed. Thus, among those ten apparatuses, the number of organic EL displaying apparatuses in which the dark spots occurred in the pixels around the pixel to which the laser beam was irradiated is equal to 0. The dark spot is a defective display in which the organic EL element performs the display at emission luminance lower than a desired value.

Comparative Example 1

Figure 9:
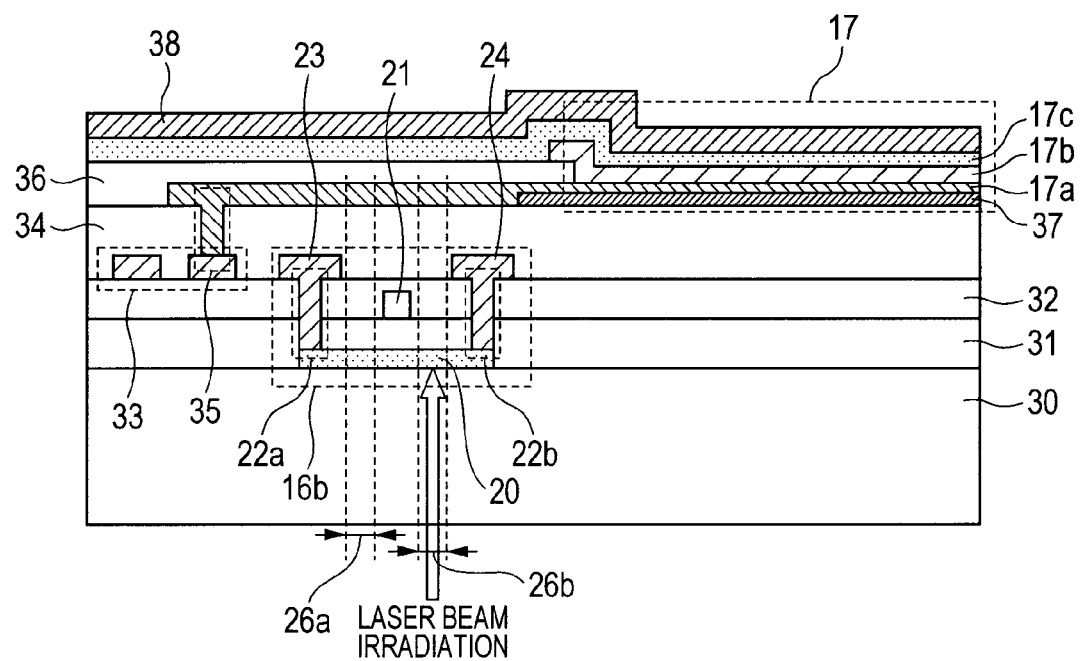
FIG. 9 is a schematic cross sectional view illustrating an organic EL displaying apparatus of a comparative example 1.

A comparative example of the present invention will be specifically described hereinbelow with reference to FIG. 9. FIG. 9 is a schematic cross sectional view illustrating an organic EL displaying apparatus of the comparative example. FIG. 9 illustrates a cross sectional structure including the driving TFT 16b as a part of the organic EL displaying apparatus of the comparative example. In the organic EL displaying apparatus of FIG. 9, members similar to those included in the organic EL displaying apparatus shown in the second embodiment are designated by the same reference numerals.

As illustrated in FIG. 9, the organic EL displaying apparatus of the comparative example has substantially the same construction as that of the organic EL displaying apparatus of the example 1 except that the region where the plane region of the driving TFT 16b in which the semiconductor layer 20 is provided and the reflecting film 37 overlap when seen as a plan view does not exist.

A plurality of organic EL displaying apparatuses of the comparative example are manufactured by substantially the same method as that in the example 1.

Subsequently, the plurality of manufactured organic EL displaying apparatuses are turned on, the display inspection is performed, and the organic EL displaying apparatuses in which the defective bright-spots occurred are extracted.

The laser beam is irradiated by the following method to the defective bright-spot pixels among the plurality of organic EL displaying apparatuses in which the defective bright-spots occurred.

In the comparative example, the laser beam is irradiated from the downward direction of the substrate 30 to the region which does not overlap the reflecting film 37 when seen as a plan view for the driving TFT 16b although it corresponds to the region 26b in FIG. 4B by using the YAG laser having a wavelength of 532 nm. That is, the laser beam is irradiated to the region which satisfies the requirements (ii), (iii) and (iv) described in the second embodiment but does not satisfy the requirement (i) described in the second embodiment.

After the laser beam was irradiated, the organic EL displaying apparatuses are turned on again, the display inspection is performed, the light emitting state at the position of the bright-spot pixel is confirmed, and ten organic EL displaying apparatuses in which the dimming of all of the defective bright-spot pixels in the organic EL displaying apparatus has been performed are extracted. In those organic EL displaying apparatuses, one to five bright-spot pixels whose dimming has been performed are included in each organic EL displaying apparatus.

Those ten organic EL displaying apparatuses are left for 5000 hours. After that, those organic EL displaying apparatuses are turned on again and the display inspection is performed. Thus, among those ten apparatuses, the number of organic EL displaying apparatuses in which the dark spots occurred in the pixels around the pixel to which the laser beam was irradiated is equal to 6. In the organic EL displaying apparatuses in which the dark spots occurred, it has been confirmed that in the region to which the laser beam was irradiated, there is a damage in the protecting film 38.

When comparing the example 1 with the comparative example 1, in the example 1, in the organic EL displaying apparatus, the plane region of the driving TFT 16b where the semiconductor layer 20 has been provided has the region which overlaps the reflecting film 37 when seen as a plan view. The laser beam is irradiated from the downward direction of the substrate 30 to the region which overlaps the reflecting film 37 when seen as a plan view. Thus, the laser beam which reaches the protecting film 38 can be reduced and the probability of occurrence of the defective display caused by the damage of the protecting film 38 can be suppressed.

While the present invention has been described with reference to exemplary embodiments, it is to be understood that the present invention is not limited to the disclosed exemplary embodiments. The scope of the following claims is to be accorded the broadest interpretation so as to encompass all such modifications and equivalent structures and functions.

This application claims the benefit of Japanese Patent Applications No. 2010-261309, filed Nov. 24, 2010, and No. 2011-213176 filed Sep. 28, 2011 which are hereby incorporated by reference herein in their entirety.

What is claimed is:

1. A dimming method of an organic EL displaying apparatus having a displaying unit constructed by combining a plurality of pixels each including: a substrate; an organic EL element formed over the substrate; a wiring layer having a power supply line to supply a voltage of a power source to the organic EL element; at least one TFT provided on a wiring path from the power supply line to the organic EL element; a reflecting film for reflecting light emitted from the organic EL element and progresses to the substrate side; and a protecting film further provided on the displaying unit
   wherein a semiconductor layer included in the TFT has a region which overlaps the reflecting film when seen as a plan view, and
   a laser beam is irradiated from a downward direction of the substrate to a region which overlaps the reflecting film when seen as a plan view and does not overlap a gate electrode, a source electrode, a drain electrode, and the wiring layer when seen as a plan view in a plane region where the semiconductor layer is provided.

2. The method according to claim 1, wherein the laser beam is irradiated from a downward direction of the substrate to a semiconductor layer included in the TFT which is arranged at a position that is closest on a circuit to the organic EL element among the TFTs which are provided on the wiring path from the power supply line to the organic EL element.

3. An organic EL displaying apparatus having the pixel whose dimming has been performed by the method according to claim 1.

4. A dimming method of an organic EL displaying apparatus having: a displaying unit constructed by combining a plurality of pixels each including a substrate, an organic EL element, a driving TFT for driving the organic EL element, a wiring layer having a power supply line to supply a voltage of a power source to the organic EL element, and a switching TFT provided on the wiring path from the power supply line to the organic EL element, a gate wiring for inputting a control signal to the switching TFT, a reflecting film for reflecting light emitted from the organic EL element and progresses to the substrate side, and a protecting film further provided on the displaying unit,
   wherein a semiconductor layer included in the TFT has a region which overlaps the reflecting film when seen as a plan view, and
   a laser beam is irradiated from a downward direction of the substrate to a region which overlaps the reflecting film when seen as a plan view and does not overlap a gate electrode, a source electrode, a drain electrode, and the wiring layer when seen as a plan view in a plane region where the semiconductor layer is provided.

5. The method according to claim 4, wherein the switching TFT has a construction in which a plurality of TFTs are connected in series, gate electrodes of the plurality of TFTs are common, the gate electrode multi-level crosses the semiconductor layer at a plurality of positions, and in the plane region where the semiconductor layer is provided, the laser beam is irradiated from the downward direction of the substrate to a region which does not overlap the gate electrode when seen as a plan view and which is provided between the multi-level crossing positions of the semiconductor layer and the gate electrode.

6. An organic EL displaying apparatus having the pixel whose dimming has been performed by the method according to claim 4.

7. The method according to claim 1, wherein the laser beam has a wavelength of the visible light region.

8. The method according to claim 7, wherein a reflectance of the surface of the thin film is equal to or larger than 40% in a visible light region.

9. A dimming method of an organic EL apparatus having a plurality of pixels each including: a substrate; an organic EL element formed over the substrate; a wiring layer having a power supply line to supply a voltage of a power source to the organic EL element; at least one TFT provided on a wiring path from the power supply line to the organic EL element; and a protecting film further provided on the plurality of pixels,
  wherein each pixel further includes a reflecting film provided between the TFT and the protecting film,
  a semiconductor layer included in the TFT has a region which overlaps the reflecting film when seen as a plan view, and
  a laser beam is irradiated from a downward direction of the substrate to a region which overlaps the reflecting film when seen as a plan view and does not overlap a gate electrode, a source electrode, a drain electrode, and the wiring layer when seen as a plan view in a plane region where the semiconductor layer is provided.

10. A dimming method of an organic EL apparatus having: a plurality of pixels each including a substrate, an organic EL element, a driving TFT for driving the organic EL element, a wiring layer having a power supply line to supply a voltage of a power source to the organic EL element, and a switching TFT provided on the wiring path from the power supply line to the organic EL element, a gate wiring for inputting a control signal to the switching TFT, and a protecting film further provided on the displaying unit,
  wherein each pixel further includes a reflecting film provided between the TFT and the protecting film,
  a semiconductor layer included in the TFT has a region which overlaps the reflecting film when seen as a plan view, and
  a laser beam is irradiated from a downward direction of the substrate to a region which overlaps the reflecting film when seen as a plan view and does not overlap a gate electrode, a source electrode, a drain electrode, and the wiring layer when seen as a plan view in a plane region where the semiconductor layer is provided.

* * * * *